United States Patent
Friedman et al.

(10) Patent No.: US 9,946,969 B2
(45) Date of Patent: *Apr. 17, 2018

(54) PRODUCING SPIKE-TIMING DEPENDENT PLASTICITY IN A NEUROMORPHIC NETWORK UTILIZING PHASE CHANGE SYNAPTIC DEVICES

(71) Applicant: International Business Machines Corporation, Armonk, NY (US)

(72) Inventors: Daniel J. Friedman, Sleepy Hollow, NY (US); Seongwon Kim, Old Tappan, NJ (US); Chung H. Lam, Peekskill, NY (US); Dharmendra S. Modha, San Jose, CA (US); Bipin Rajendran, White Plains, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/990,721

(22) Filed: Jan. 7, 2016

(65) Prior Publication Data
US 2016/0224890 A1    Aug. 4, 2016

Related U.S. Application Data

(63) Continuation of application No. 12/895,791, filed on Sep. 30, 2010, now Pat. No. 9,269,042.

(51) Int. Cl.
*G06N 3/06* (2006.01)
*G06N 3/04* (2006.01)
(Continued)

(52) U.S. Cl.
CPC .............. *G06N 3/06* (2013.01); *G06N 3/049* (2013.01); *G06N 3/063* (2013.01); *G06N 3/0635* (2013.01);
(Continued)

(58) Field of Classification Search
CPC ........ G06N 3/049; G06N 3/063; G11C 11/54; G11C 13/0004
(Continued)

(56) References Cited

U.S. PATENT DOCUMENTS 4,876,668 A   10/1989 Thakoor et al.
5,010,512 A    4/1991 Hartstein et al.
(Continued)

FOREIGN PATENT DOCUMENTS

JP    05314287 A   11/1993
JP     8006915 A    1/1996
(Continued)

OTHER PUBLICATIONS

Implementing Learning on the SpiNNaker Universal Neural Chip Multiprocessor, Jin et al., School of Computer Science, University of Manchester, Dec. 2009.*
(Continued)

*Primary Examiner* — Lut Wong
(74) *Attorney, Agent, or Firm* — Sherman IP LLP; Kenneth L. Sherman; Hemavathy Perumal

(57) ABSTRACT

Embodiments of the invention relate to a neuromorphic network for producing spike-timing dependent plasticity. The neuromorphic network includes a plurality of electronic neurons and an interconnect circuit coupled for interconnecting the plurality of electronic neurons. The interconnect circuit includes plural synaptic devices for interconnecting the electronic neurons via axon paths, dendrite paths and membrane paths. Each synaptic device includes a variable state resistor and a transistor device with a gate terminal, a source terminal and a drain terminal, wherein the drain terminal is connected in series with a first terminal of the variable state resistor. The source terminal of the transistor device is connected to an axon path, the gate terminal of the (Continued)

transistor device is connected to a membrane path and a second terminal of the variable state resistor is connected to a dendrite path, such that each synaptic device is coupled between a first axon path and a first dendrite path, and between a first membrane path and said first dendrite path.

17 Claims, 20 Drawing Sheets

(51) Int. Cl.
| | |
|---|---|
| *G06N 3/063* | (2006.01) |
| *G11C 11/54* | (2006.01) |
| *G11C 13/00* | (2006.01) |
| *G06N 3/08* | (2006.01) |

(52) U.S. Cl.
CPC .............. *G06N 3/08* (2013.01); *G11C 11/54* (2013.01); *G11C 13/0004* (2013.01)

(58) Field of Classification Search
USPC ............................................. 706/27, 33, 39
See application file for complete search history.

(56) References Cited

U.S. PATENT DOCUMENTS

| | | | |
|---|---|---|---|
| 5,264,734 | A | 11/1993 | Holler et al. |
| 5,274,744 | A | 12/1993 | Yu et al. |
| 5,895,460 | A | 4/1999 | Gorelik |
| 5,912,839 | A | 6/1999 | Ovshinsky et al. |
| 6,141,241 | A | 10/2000 | Ovshinsky, Sr. et al. |
| RE37,259 | E | 7/2001 | Ovshinsky |
| 6,470,328 | B1 | 10/2002 | Varshavsky |
| 6,844,582 | B2 | 1/2005 | Ueda et al. |
| 6,995,649 | B2 | 2/2006 | Nugent |
| 7,039,619 | B2 | 5/2006 | Nugent |
| 7,319,608 | B2 | 1/2008 | Hsu et al. |
| 7,339,815 | B2 | 3/2008 | Wicker |
| 7,392,230 | B2 | 6/2008 | Nugent |
| 7,426,501 | B2 | 9/2008 | Nugent |
| 7,430,546 | B1 | 9/2008 | Suri |
| 7,466,584 | B1 | 12/2008 | Parkinson et al. |
| 7,499,303 | B2 | 3/2009 | Lien et al. |
| 7,502,769 | B2 | 3/2009 | Nugent |
| 7,511,532 | B2 | 3/2009 | Derharcobian et al. |
| 7,623,370 | B2 | 11/2009 | Toda et al. |
| 7,675,765 | B2 | 3/2010 | Derharcobian et al. |
| 7,767,997 | B2 | 8/2010 | Sasago et al. |
| 7,978,510 | B2 | 7/2011 | Modha et al. |
| 8,250,010 | B2 | 8/2012 | Modha et al. |
| 8,253,607 | B2 | 8/2012 | Markram |
| 8,269,207 | B2 | 9/2012 | Toda |
| 2004/0139040 | A1 | 7/2004 | Nervegna et al. |
| 2004/0162796 | A1 | 8/2004 | Nugent |
| 2004/0193558 | A1 | 9/2004 | Nugent |
| 2005/0015351 | A1 | 1/2005 | Nugent |
| 2006/0198209 | A1 | 9/2006 | Tran |
| 2007/0092958 | A1 | 4/2007 | Syed et al. |
| 2007/0208678 | A1 | 9/2007 | Matsugu |
| 2008/0162391 | A1 | 7/2008 | Izhikevich |
| 2008/0246116 | A1 | 10/2008 | Mouttet |
| 2008/0258767 | A1* | 10/2008 | Snider ................... G06N 3/063 326/46 |
| 2009/0099989 | A1 | 4/2009 | Ananthanarayanan et al. |
| 2009/0132451 | A1 | 5/2009 | Fiorillo |
| 2009/0292661 | A1 | 11/2009 | Haas |
| 2010/0223220 | A1 | 9/2010 | Modha et al. |
| 2010/0299297 | A1 | 11/2010 | Breitwisch et al. |
| 2010/0312730 | A1 | 12/2010 | Weng et al. |
| 2011/0004579 | A1 | 1/2011 | Snider |
| 2011/0119214 | A1 | 5/2011 | Breitwisch et al. |
| 2011/0137843 | A1 | 6/2011 | Poon et al. |
| 2011/0153533 | A1 | 6/2011 | Jackson et al. |
| 2012/0011090 | A1 | 1/2012 | Tang et al. |
| 2012/0011092 | A1 | 1/2012 | Tang et al. |
| 2012/0011093 | A1 | 1/2012 | Aparin et al. |
| 2012/0036099 | A1 | 2/2012 | Venkatraman et al. |
| 2012/0084240 | A1 | 4/2012 | Esser et al. |
| 2012/0109863 | A1 | 5/2012 | Esser et al. |
| 2012/0109864 | A1 | 5/2012 | Modha |
| 2012/0109866 | A1 | 5/2012 | Modha |
| 2012/0117012 | A1 | 5/2012 | Szatmary et al. |
| 2012/0150781 | A1 | 6/2012 | Arthur et al. |
| 2012/0173471 | A1 | 7/2012 | Ananthanarayanan et al. |
| 2012/0265719 | A1 | 10/2012 | Modha et al. |
| 2016/0224887 | A1 | 8/2016 | Friedman et al. |

FOREIGN PATENT DOCUMENTS

| | | |
|---|---|---|
| JP | 2009026181 A | 2/2009 |
| WO | 9535548 A1 | 12/1995 |
| WO | 2006100209 A2 | 9/2006 |

OTHER PUBLICATIONS

Building Blocks for Electronic Spiking Neural Networks, by A. van Schaik, published 2001.*

Hierarchical Recurrent Neural Networks for Long-Term Dependencies, by Hihi, published 1996.*

Mira, J. et al., "Artificial Neural Nets Problem Solving Methods", Proceedings of the Seventh International Work-Conference on Artificial and Natural Neural Networks (IWANN '03), Jun. 2003, pp. xxvii-820, Springer, USA [Part 1, pp. i-400].

Mira, J. et al., "Artificial Neural Nets Problem Solving Methods", Proceedings of the Seventh International Work-Conference on Artificial and Natural Neural Networks (IWANN '03), Jun. 2003, pp. xxvii-820, Springer, USA [Part 2, pp. 401-820].

Salinas, E. et al., "Integrate-and-Fire Neurons Driven by Correlated Stochastic Input", Neural Computation, Sep. 2002, pp. 2111-2155, vol. 14, No. 9, MIT Press, United States.

Brader, J.M. et al., "Learning Real-World Stimuli in a Neural Network with Spike-Driven Synaptic Dynamics", Neural Computation, Nov. 2007, pp. 2881-2912, vol. 19, No. 11, MIT Press, USA.

Kasabov, N. et al., "Integrative Connectionist Learning Systems Inspired by Nature: Current Models, Future Trends and Challenges", Natural Computing: An International Journal, Jun. 2009, pp. 199-218, vol. 8, No. 2, Kluwer Academic Publishers, USA.

Senn, W. et al., "Convergence on Stochastic Learning in Perceptrons with Binary Synapses", Physical Review E (Statistical, Nonlinear, and Soft Matter Physics), Jun. 2005, pp. 1-12, vol. 71, No. 6, The American Physical Society, USA.

Emery, R. et al., "Connection-Centric Network for Spiking Neural Networks", Proceedings of the 2009 Third ACM/IEEE International Symposium on Networks-on-Chip (NoCS '09), May 2009, pp. 144-152, IEEE, USA.

Shen, X. et al., "Oscillations and Spiking Pairs: Behavior of a Neuronal Computation, Model with STDP Learning", Neural Aug. 2008, pp. 2037-2069, vol. 20, No. 8, MIT Press, USA.

Bofill-I-Petit, A. et al., "Synchrony Detection and Amplification by Silicon Neurons with STDP Synapses", IEEE Transactions on Neural Networks, Sep. 2004, pp. 1296-1304, vol. 15, No. 5, IEEE, USA.

Wang, S. et al., "Improvement of Signal Transmission Through Spike-Timing-Dependent Plasticity in Neural Networks", The European Journal B—Condensed Matter and Complex Systems, Jun. 2004, pp. 351-356, vol. 39, No. 3, Springer Verlag, Germany.

Bodyanskiy, Y. et al., "A Self-Learning Spiking Neural Network for Fuzzy Clustering Task", Scientific Proceedings of Riga Technical University, Series 5: Computer Science, 2008, pp. 27-33, vol. 36, Riga Technical University, Latvia (Abstract Only).

Likharev, K., "Hybrid CMOS/Nanoelectronic Circuits: Opportunities and Challenges", Journal of Nanoelectronics and Optoelectronics, Dec. 2008, pp. 203-230, vol. 3, No. 3, American Scientific Publishers, USA.

Yeh, C. et al., "The Design of CMOS Cellular Neural Network (CNN) Using the Neuron-Bipolar Junction Transistor (vBJT)",

(56) References Cited

OTHER PUBLICATIONS

Proceedings of the 1999 International Conference on Neural Networks (IJCNN '99), Jul. 10-16, 1999, pp. 2337-2342, vol. 4, IEEE, USA.

Kim, S. et al., "A Programmable Analog CMOS Synapse for Neural Networks," Analog Integrated Circuits and Signal Processing, Nov. 1992, pp. 345-352, vol. 2, No. 4, Kluwer Academic Publishers, USA.

Zanos, T.P. et al., "Nonlinear Modeling of Causal Interrelationships in Neuronal Ensembles", IEEE Transactions on Neural Systems and Rehabilitation Engineering, Aug. 2008, pp. 336-352, vol. 16, No. 4, IEEE, USA.

Mira, J. et al., "The Knowledge Engineering Approach to Autonomous Robotics", Proceedings of the Seventh International Work-Conference on Artificial and Natural Neural Networks (IWANN '03), Jun. 2003, pp. 161-168, Springer Berlin Heidelberg, Germany.

Jin, X. et al., "Implementing Learning on the SpiNNaker Universal Neural Chip Multiprocessor", Proceedings of the 16th International Conference on Neural Information Processing (ICONIP '09), Dec. 2009, pp. 425-432, vol. 5863, Springer Berlin Heidelberg, Germany.

Borghetti, Z.L. et al., "A Hybrid Nanomemristor/Transistor Logic Circuit Capable of Self-Programming", Proceedings of the National Academy of Sciences of the United States of America, Feb. 10, 2009, pp. 1699-1703, vol. 106, No. 6, The National Academy of Sciences of the USA, USA.

Linares-Barranco, B. et al., "Exploiting Memristance for Implementing Spike-Time-Dependent-Plasticity in Neuromorphic Nanotechnology Systems", Proceedings of the Ninth IEEE Conference on Nanotechnology, Jul. 2009, pp. 601-604, IEEE, USA.

Schemmel, J. et al., "Implementing Synaptic Plasticity in a VLSI Spiking Neural Network Model", Proceedings of the 2006 International Joint Conference on Neural Networks (IJCNN '06), Jul. 2006, pp. 1-6, IEEE, USA.

Van Schaik, A., Buidling blocks for electronic spiking neural networks, Neural Networks, Jan. 31, 2001, pp. 617-628, Issue 14, Elsevier Scient Ltd., United States.

U.S. Non-Final Office Action for U.S. Appl. No. 12/895,791 dated Dec. 3, 2012.

U.S. Final Office Action for U.S. Appl. No. 12/895,791 dated Jun. 6, 2013.

U.S. Non-Final Office Action for U.S. Appl. No. 12/895,791 dated Apr. 2, 2015.

U.S. Final Office Action for U.S. Appl. No. 12/895,791 dated Aug. 10, 2015.

U.S. Notice of Allowance for U.S. Appl. No. 12/895,791 dated Oct. 13, 2015.

U.S. Non-Final Office Action for U.S. Appl. No. 12/895,710 dated Dec. 3, 2012.

U.S. Final Office Action for U.S. Appl. No. 12/895,710 dated Jun. 6, 2013.

U.S. Non-Final Office Action for U.S. Appl. No. 12/895,710 dated Sep. 27, 2013.

U.S. Final Office Action for U.S. Appl. No. 12/895,710 dated Apr. 10, 2014.

U.S. Final Office Action for U.S. Appl. No. 14/990,720 dated Jan. 20, 2017.

U.S. Advisory Action for U.S. Appl. No. 14/990,720 dated Apr. 5, 2017.

U.S. Non-Final Office Action for U.S. Appl. No. 14/990,720 dated Sep. 1, 2016.

U.S. Non-Final Office Action for U.S. Appl. No. 14/990,720 dated Jun. 22, 2017.

U.S. Notice of Allowance for U.S. Appl. No. 14/990,720 dated Dec. 13, 2017.

* cited by examiner

PRODUCING SPIKE-TIMING DEPENDENT PLASTICITY IN A NEUROMORPHIC NETWORK UTILIZING PHASE CHANGE SYNAPTIC DEVICES

This invention was made with Government support under Agreement No. HR0011-09-C-0002 awarded by Defense Advanced Research Projects Agency (DARPA). The Government has certain rights in the invention.

BACKGROUND

The present invention relates generally to neuromorphic systems, and more specifically, to neuromorphic networks utilizing phase change devices.

Biological systems impose order on the information provided by their sensory input. This information typically comes in the form of spatiotemporal patterns comprising localized events with a distinctive spatial and temporal structure. These events occur on a wide variety of spatial and temporal scales, and yet a biological system such as the brain is still able to integrate them and extract relevant pieces of information. Such biological systems can rapidly extract signals from noisy spatiotemporal inputs.

In biological systems, the point of contact between an axon of a neuron and a dendrite on another neuron is called a synapse, with respect to the synapse, the two neurons are respectively called pre-synaptic and post-synaptic. The essence of our individual experiences is stored in the conductance of the synapses. The synaptic conductance can change with time as a function of the relative spike times of pre-synaptic and post-synaptic neurons, as per spike-timing dependent plasticity (STDP). The STDP rule increases the conductance of a synapse if its post-synaptic neuron fires after its pre-synaptic neuron fires, and decreases the conductance of a synapse if the order of the two firings is reversed.

Neuromorphic systems, also referred to as artificial neural networks, are computational systems that permit electronic systems to essentially function in a manner analogous to that of biological systems. Neuromorphic systems do not generally utilize the traditional digital model of manipulating 0s and 1s. Instead, neuromorphic systems create connections between processing elements that are roughly functionally equivalent to neurons of a biological brain. Neuromorphic systems may comprise various electronic circuits that are modeled on biological neurons.

BRIEF SUMMARY

Embodiments of the invention provide a neuromorphic network for producing spike-timing dependent plasticity. The neuromorphic network includes a plurality of electronic neurons and an interconnect circuit coupled for interconnecting the plurality of electronic neurons. The interconnect circuit includes plural synaptic devices for interconnecting the electronic neurons via axon paths, dendrite paths and membrane paths. Each synaptic device includes a variable state resistor and a transistor device with a gate terminal, a source terminal and a drain terminal, wherein the drain terminal is connected in series with a first terminal of the variable state resistor. The source terminal of the transistor device is connected to an axon path, the gate terminal of the transistor device is connected to a membrane path and a second terminal of the variable state resistor is connected to a dendrite path, such that each synaptic device is coupled between a first axon path and a first dendrite path, and between a first membrane path and said first dendrite path.

A timing controller generates a timing signal for controlling phased operation of the electronic neurons. The timing signal provides a sequence of phases, wherein activity of each electronic neuron is confined to said phases such that the synaptic devices provide spike-timing dependent plasticity based on the activity of the electronic neurons in a time phased fashion.

In another embodiment, the invention provides a probabilistic asynchronous neuromorphic network for producing spike-timing dependent plasticity. The network comprises a plurality of electronic neurons and an interconnect circuit coupled to the plurality of electronic neurons to interconnect the plurality of electronic neurons. The interconnect circuit comprises a plurality of axons and a plurality of dendrites such that the axons and dendrites are orthogonal to one another. The interconnect circuit further comprises plural synaptic devices for interconnecting the electronic neurons via axons and dendrites, such that each synaptic device comprises a binary state memory device at a cross-point junction of the interconnect circuit coupled between a dendrite and an axon.

The interconnect circuit further comprises a plurality of dendrite drivers corresponding to the plurality of dendrites, each dendrite driver coupled to a dendrite at a first side of the interconnect circuit. The interconnect circuit further comprises a plurality of axon drivers corresponding to the plurality of axons, each axon driver coupled to an axon at a second side of the interconnect circuit. Wherein an axon driver and a dendrite driver coupled by a binary state memory device at a cross-point junction are configured to generate stochastic signals which in combination are capable of changing the state of the binary state memory device as a function of time since a last spiking of an electronic neuron firing a spiking signal into the axon driver and the dendrite driver such that the binary state memory device provides spike-timing dependent plasticity.

The network further comprises a timing controller that generates a timing signal for controlling phased operation of the electronic neurons. The timing signal provides a sequence of phases, wherein activity of each electronic neuron is confined to said phases such that the synaptic devices provide spike-timing dependent plasticity based on the activity of the electronic neurons in a time phased fashion. Each axon driver and each dendritic driver includes a stochastic signal generator for generating a stochastic signal based on spiking of an associated neuron.

These and other features, aspects and advantages of the present invention will become understood with reference to the following description, appended claims and accompanying figures.

DETAILED DESCRIPTION

Embodiments of the invention provide neural systems comprising neuromorphic networks including spiking neuronal networks based on Spike Timing Dependent Plasticity (STDP) learning rules for neuromorphic integrated circuits. One embodiment of the invention provides spike-based computation using complementary metal-oxide-semiconductor (CMOS) electronic neurons interacting with each other through nanoscale memory synapses such as Phase Change Memory (PCM) circuits.

In a neuromorphic network comprising electronic neurons interconnected via programmable electronic synapses, the synaptic conductance changes with time as a function of the relative spike times of pre-synaptic and post-synaptic neurons as per STDP. Specifically, a STDP learning rule programs a synapse by increasing the conductance of the synapse if its post-synaptic neuron fires after its pre-synaptic neuron fires, and decreases the conductance of a synapse if the order of two firings is reversed. The learning rules are defined by STDP, wherein the synaptic conductance changes with time as a function of the relative spike times of pre-synaptic and post-synaptic neurons. The change in synapse conductance depends on the precise delay between the firing events at the corresponding post-synaptic and pre-synaptic neurons. The longer the delay, the less the magnitude of synaptic conductance changes.

Figure 1:
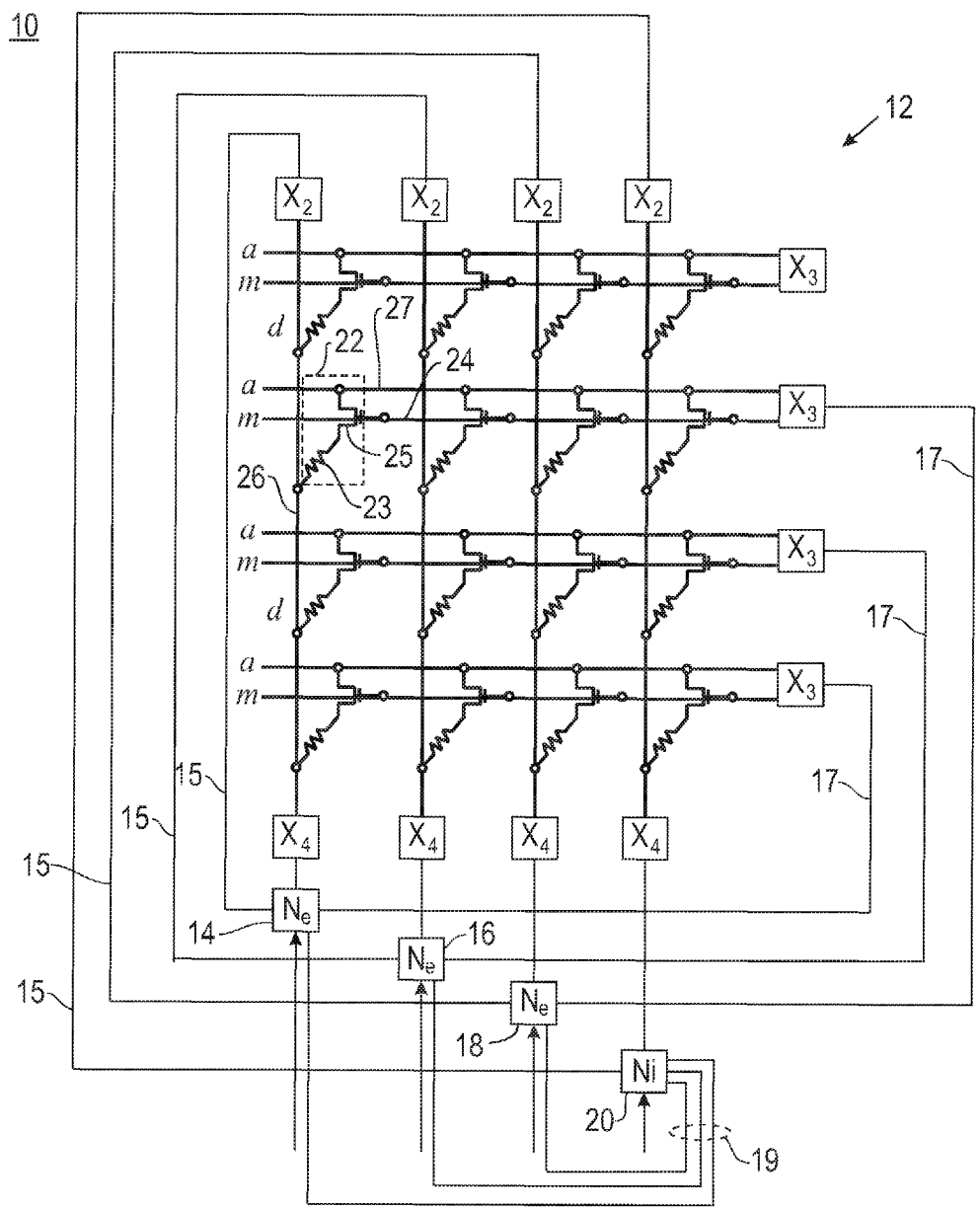
FIG. 1 shows a diagram of a neuromorphic network comprising a transistor driven Phase Change Memory (PCM) synaptic cross-bar array circuit for spiking computation, in accordance with an embodiment of the invention.

Referring now to FIG. 1, there is shown a diagram of a neuromorphic system 10 comprising a cross-bar array 12 coupled to a plurality of neurons 14, 16, 18 and 20 as a network. These neurons are also referred to herein as "electronic neurons". In one example, the cross-bar array may have a pitch in the range of about 0.1 nm to 10 µm. The system 10 further comprises synapse devices 22 including variable state resistors 23 at the cross-point junctions of the cross-bar array 12, wherein the synapse devices 22 are connected to axon paths 24, dendrite paths 26 and membrane paths 27, such that the axon paths 24 and membrane paths 27 are orthogonal to the dendrites 26. The terms "axon path", "dendrite path" and "membrane path", are referred to hereinbelow as "axon", "dendrite" and "membrane", respectively.

The term variable state resistor refers to a class of devices in which the application of an electrical pulse (either a voltage or a current) will change the electrical conductance characteristics of the device. For a general discussion of cross-bar array neuromorphic systems as well as to variable state resistors as used in such cross-bar arrays, reference is made to K. Likharev, "Hybrid CMOS/Nanoelectronic Circuits: Opportunities and Challenges", J. Nanoelectronics and Optoelectronics, 2008, Vol. 3, p. 203-230, 2008, which is hereby incorporated by reference. In one embodiment of the invention, the variable state resistor may comprise a PCM synapse device. Besides PCM devices, other variable state resistor devices that may be used in embodiments of the invention include devices made using metal oxides, sulphides, silicon oxide and amorphous silicon, magnetic tunnel junctions, floating gate field-effect transistors (FETs), and organic thin film layer devices, as described in more detail in the above-referenced article by K. Likharev. The variable state resistor may also be constructed using a static random access memory device.

A spiking electronic neuron integrates inputs from other neurons through programmable PCM synapses, and spikes when the integrated input exceeds a pre-determined threshold. In an implementation of STDP in a neuromorphic network, called binary probabilistic STDP, each electronic neuron remembers its last spiking event using a simple resistor-capacitor (RC) circuit. Thus, when an electronic neuron spikes, several events occur, as described below. In one example, the spiking neuron charges an internal "memory" capacitor to $V_0$, wherein the potential across the capacitor decays according to $V_t=V_0 e^{-t/RC}$, with RC=50 ms.

The spiking neuron sends a nanosecond "alert" pulse on its axons and dendrites. If the alert pulse generated at the axon is a voltage spike, then downstream neurons receive a current signal, weighted by the conductance of a PCM synapse between each pair of involved neurons (which can then be integrated by the downstream neurons). The alert pulse generated at the dendrite is not integrated by upstream neurons, but serves as a hand-shake signal, relaying information to those neurons indicating that a programming pulse for the synapses is imminent.

After a finite delay, the spiking neuron generates a semi-programming pulse, which in itself cannot induce the programming of the PCM synapse. The upstream and downstream neurons that received the alert pulse earlier respond via appropriate pulses with modulated amplitude (depending on the time elapsed since last firing of each neuron as retained in internal capacitors). Each response pulse combines with the semi-programming pulse to program each PCM synapse at the cross-point junction of involved neurons to achieve STDP. The post-synaptic neurons respond by sending rectangular pulses, which effectively increase the PCM resistance (i.e., decrease conductance) of a synapse and the pre-synaptic neurons respond by sending triangular pulses, which effectively decrease the PCM resistance (i.e., increase conductance) of a synapse.

The cross-bar array 12 comprises a nanoscale cross-bar array comprising said resistors 23 at the cross-point junctions, employed to implement arbitrary and plastic connectivity between said electronic neurons. Each synapse device 22 further comprises an access or control device 25 comprising a FET which is not wired as a diode, at every cross-bar junction to prevent cross-talk during signal communication (neuronal firing events) and to minimize leakage and power consumption.

As shown in FIG. 1, the electronic neurons 14, 16, 18 and 20 are configured as circuits at the periphery of the cross-bar array 12. In addition to being simple to design and fabricate, the cross-bar architecture provides efficient use of the available space. Complete neuron connectivity inherent to the full cross-bar array can be converted to any arbitrary connectivity by electrical initialization or omitting mask steps at undesired locations during fabrication. The cross-bar array 12 can be configured to customize communication between the neurons (e.g., a neuron never communicates with another neuron). Arbitrary connections can be obtained by blocking certain synapses at fabrication level. Therefore, the architectural principle of the system 10 can mimic all the direct wiring combinations observed in biological neuromorphic networks.

The cross-bar array 12 further includes driver devices $X_2$, $X_3$ and $X_4$ as shown in FIG. 1. The devices $X_2$, $X_3$ and $X_4$ comprise interface driver devices. Specifically, the dendrites 26 have driver devices $X_2$ on one side of the cross-bar array 12 and level translator devices (e.g., sense amplifiers) $X_4$ on the other side of the cross-bar array. The axons 24 have driver devices $X_3$ on one side of the cross-bar array 12. The driver devices comprise CMOS logic circuits implementing the functions described herein according to embodiments of the invention.

The sense amplifier devices $X_4$ feed into excitatory spiking electronic neurons ($N_e$) 14, 16 and 18, which in turn connect into the axon driver devices $X_3$ and dendrite driver devices $X_2$. The neuron 20 is an inhibitory spiking electronic neuron ($N_i$). Generally, an excitatory spiking electronic neuron makes its target neurons more likely to fire, while an inhibitory spiking electronic neuron makes its target neurons less likely to fire. A variety of implementations of spiking electronic neurons can be utilized. Generally, such neurons comprise a counter that increases when inputs from source excitatory neurons are received and decreases when inputs from source inhibitory neurons are received. The amount of the increase or decrease is dependent on the strength of the connection from a source neuron to a target neuron. If the counter reaches a certain threshold, the neuron then generates its own spike (i.e., fires) and the counter undergoes a reset to a baseline value. The term spiking electronic neuron is referred to as "electronic neuron" herein.

In one example scenario, the neurons 14, 16, 18 and 20 are dendritic neurons. Each dendritic neuron receives input from a corresponding translator device $X_4$. The neurons 14, 16, 18 and 20 also contain outputs and generate signals along paths 15 and 17 to a plurality of the devices $X_2$, $X_3$, respectively. Thus, the neurons 14, 16, 18 and 20 will function as axonal neurons when generating outputs along axonal connections. When any of the neurons 14, 16, 18 and 20 fire, they will send a pulse out to their axonal and to their dendritic connections.

In this example, each of the excitatory neurons 14, 16, 18 ($N_e$) is configured to provide integration and firing. Each inhibitory neuron 20 (NO is configured to regulate the activity of the excitatory neurons depending on overall network activity. As those skilled in the art will recognize, the exact number of excitatory neurons and inhibitory neurons can vary depending on the nature of the problem to solve using the disclosed architecture herein.

A read spike of a short duration may be applied to an axon driver device $X_3$ for communication. An elongated pulse may be applied to the axon driver device $X_3$ and a short negative pulse may be applied to the dendrite driver device $X_2$ midway through the axon driver pulse for programming. As such, the axon driver device $X_3$ provides a long programming pulse and communication spikes. A dendrite driver device $X_2$ provides a programming pulse with a delay. In one embodiment of the invention where a neuron circuit is implemented using analog logic circuits, a corresponding sense amplifier $X_4$ translates PCM current levels to neuron current levels for integration. In another embodiment of the invention where a neuron circuit is implemented using digital logic circuits, a corresponding sense amplifier $X_4$ translates PCM current levels to binary digital signals for integration.

The FET driven PCM synaptic devices 22 implement STDP in a time phased fashion. Such an implementation allows realization of high density electronic spiking neuronal networks, wherein spiking of neurons are restricted to certain time phases or a global timing reference, providing programming activity in synapses that are phased. In general, in accordance with an embodiment of the invention, axonal neurons "spike" or "fire" (transmit a pulse) when the inputs they receive from dendritic input connections exceed a threshold. In one example, a typical frequency required to mimic biological phenomena is about 10 KHz, leaving an ample time window for communication and programming of nanoscale electronic components.

In one embodiment of the invention, synaptic weight updates and communication in the neuromorphic network 10 are restricted to specific phases of a global timing reference signal (i.e., global clock), to achieve STDP. As the communication in the network is restricted to certain phases of the global timing reference signal, the FET devices 25 are utilized as access or control devices in the PCM synapses 22. When a neuron spikes, the spike is communicated to $X_2$ and $X_3$ drivers, wherein each $X_3$ driver control the source and the gate of a FET 25 in a corresponding synapse 22 via two conductive paths 24 and 27, respectively (described further below). In each synapse 22, the gate terminal of each FET is used as a membrane connected to a pre-synaptic neuron to enable precise control over the current flowing through the connected programmable resistor.

In general, the combined action of the signals from drivers $X_2$ and $X_3$ in response to spiking signals from the firing neurons in the cross-bar array 12, causes the corresponding resistors 23 in synapses 22 at the cross-bar array junctions thereof, to change value based on the spiking timing action of the firing neurons. This provides programming of the resistors 23. In an analog implementation of a neuron, each level translator device $X_4$ comprises a circuit configured to translate the amount of current from each corresponding synapse 22 for integration by the corresponding neuron. For a digital implementation of a neuron, each level translator device $X_4$ comprises a sense amplifier for accomplishing the same function.

The timing in delivering signals from the neurons in the cross-bar array 12 to the devices $X_2$, $X_3$, $X_4$, and the timing of the devices $X_2$, $X_3$, $X_4$ in generating signals, allows programming of the synapses. One implementation comprises changing the state of a resistor 23 by increasing or decreasing conductance of the resistor 23 as a function of time since a last spiking of an electronic neuron firing a spiking signal into the axon driver and the dendrite driver coupled by the resistor 23. In general, neurons generate spike signals and the devices $X_2$, $X_3$, and $X_4$ interpret the spikes signals, and in response generate signals described above for programming the synapses 22. The synapses and neurons can be analog or digital.

In one example, a read spike of a short duration (e.g., about 0.1 ms long) is applied to an axon driver device $X_3$ for communication. An elongated pulse (e.g., about 200 ms long) is applied to the axon driver device $X_3$. A short negative pulse (e.g., about 50 ns long) is applied to the dendrite driver device $X_2$ about midway through the axon driver pulse for programming the synapses 22. As such, the axon driver device $X_3$ provides a long programming pulse and communication spikes.

Circuit area required for each synapse 22 including a FET connected according to embodiments of the invention is less than that required for a synapse utilizing a FET connected as a diode. The biological analog for the synapse 22 is that there are two mechanisms of conduction at the synapse: the first being chemical and the second being electrical.

Figure 2:
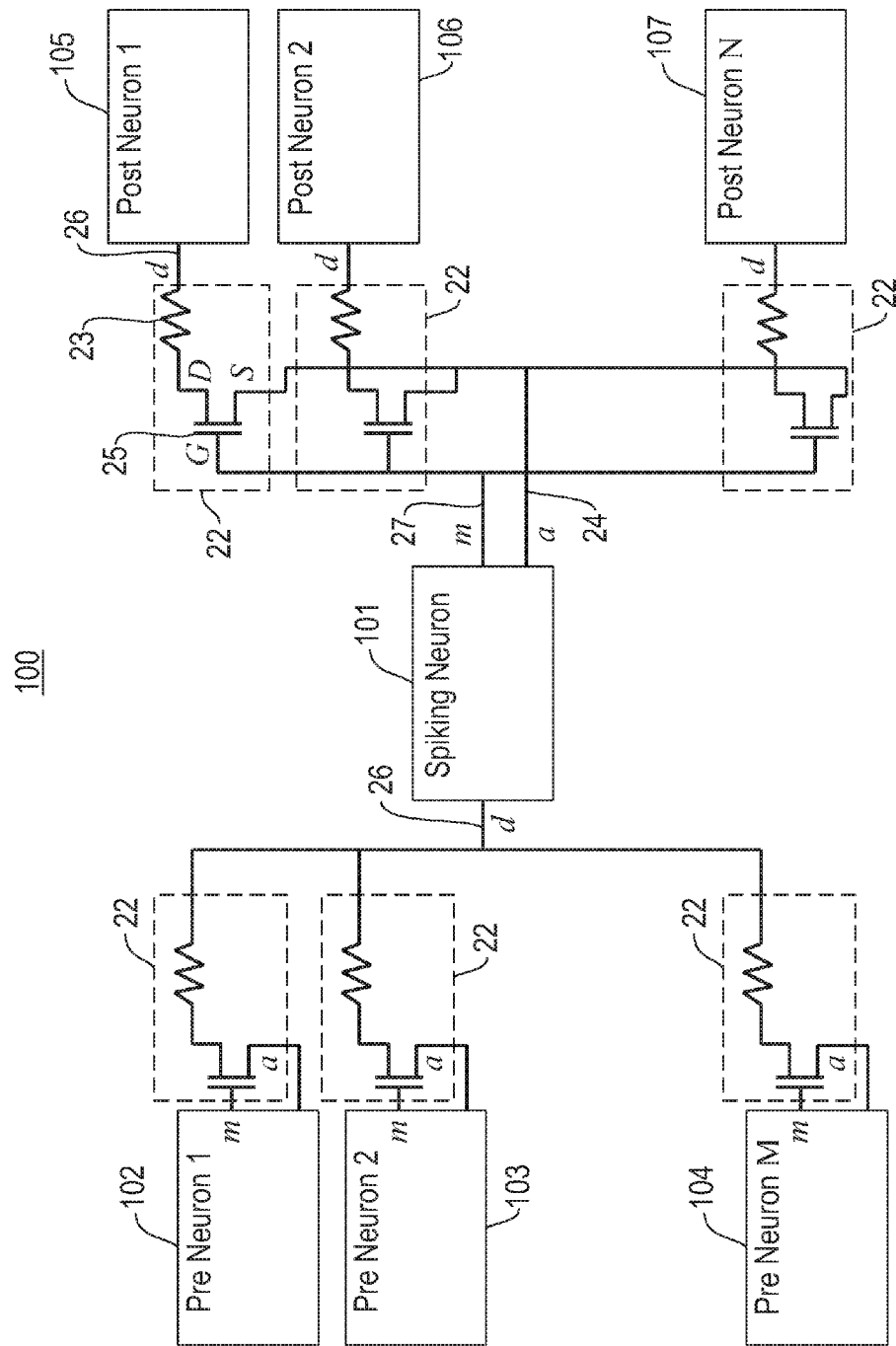
FIG. 2 shows a neuron-centric diagram of an implementation of the transistor driven PCM synaptic neuromorphic network of FIG. 1, in accordance with an embodiment of the invention.

FIG. 2 shows a diagram of an example neuromorphic network 100, according to an embodiment of the invention, comprising electronic neurons 101, 102, 103, 104, 105, 106 and 107 interconnected via synapses 22. Each of the synapses 22 includes a variable state resistor 23 and a FET 25, as described above. In each synapse 22, the resistor 23 comprises a PCM device connected in series with the drain terminal D of a FET 25, wherein the source terminal S of the FET 25 functions as an axon a, the gate terminal G of the FET 25 functions as a gating membrane m, and the top electrode of the resistor 23 functions as a dendrite d. The interconnections between the neurons and synapses in FIG. 2 is based on a cross-bar array, such as shown in FIG. 1. The neurons comprise CMOS circuits for integrate-and-fire functions to implement binary probabilistic STDP in synapses 22.

In one example scenario, the neuron 101 functions as a spiking neuron, wherein the neurons 102, 103 and 104 function as pre-synaptic neurons in relation to the neuron 101, and the neurons 105, 106 and 107 function as post-synaptic neurons in relation to the neuron 101.

The FET driven PCM synaptic devices 22 implement STDP in a time phased fashion. Spiking of neurons are restricted to certain time phases based on a global timing reference, providing programming activity in synapses that are phased. In the network 100, the function of each neuron at any instant in time is determined by a global timing reference signal. The functions of the neuron comprise an evaluation phase, a communication phase and a programming phase. The programming phase includes two programming intervals intended to decrease or increase the resistance of a synapse. A set of evaluation, communication and programming phases in order form a cycle, and the cycles repeat one after another. The timing of the phases and cycles are controlled by a timing controller providing a global timing reference signal.

Figure 3:
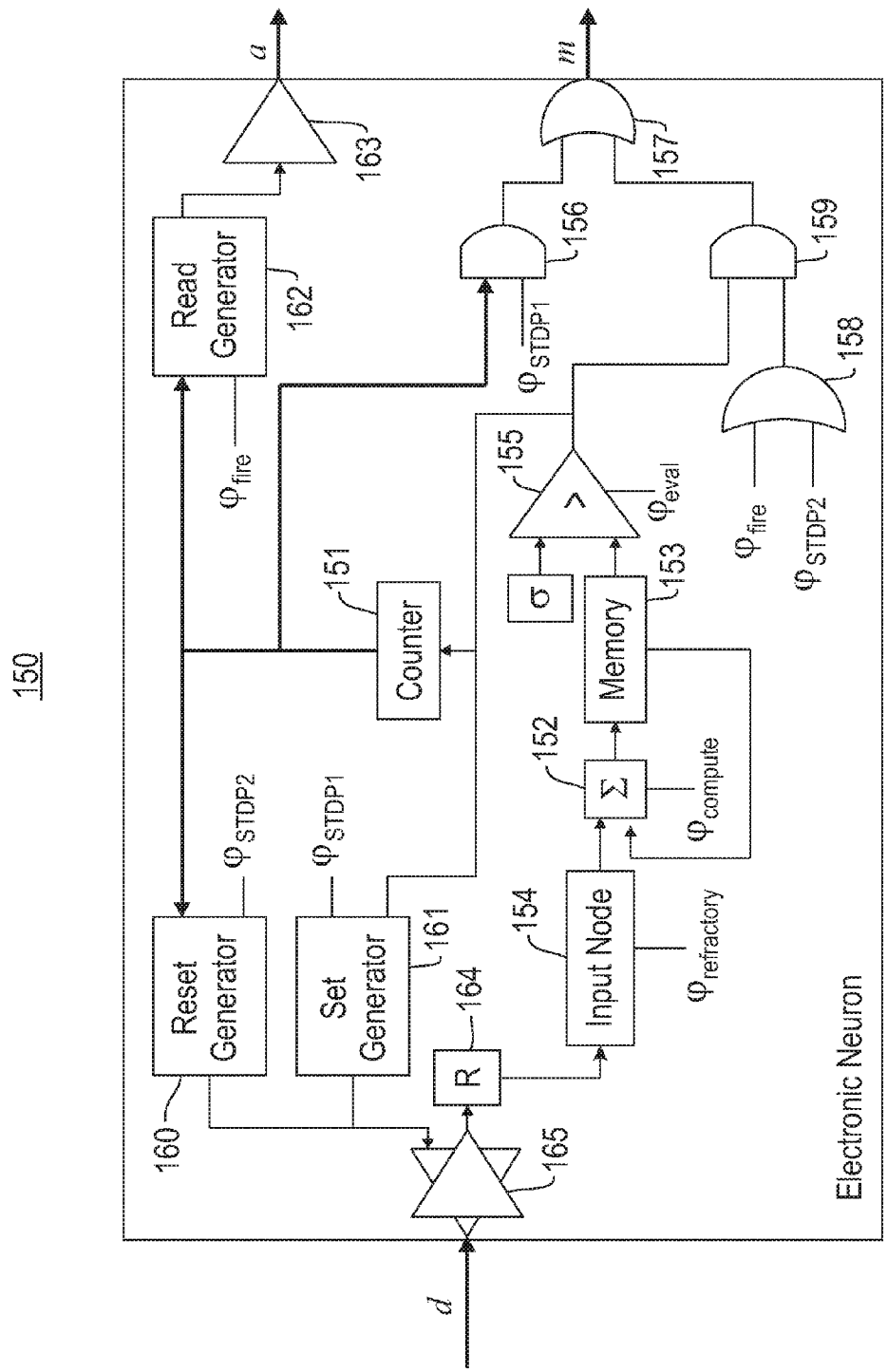
FIG. 3 shows a diagram of an electronic neuron for the neuromorphic network of FIG. 2, in accordance with an embodiment of the invention.

FIG. 3 shows a diagram of an electronic circuit 150 for an electronic neuron in the network 100, according to an embodiment of the invention. Function of the neurons at any instant in time is determined by a global timing reference signal. Each neuron includes an internal counter 151 that keeps track of the time elapsed since the moment of last firing event of the neuron. A summer 152 and memory 153 are configured to essentially integrate input from a node 154. If the integrated input exceeds the pre-determined threshold value in the evaluation phase, then the time counter that keeps track of the time is initialized to begin its operation of time counting.

During the evaluation phase, the neuron determines if the total integrated input in its main memory 153 exceeds a pre-determined threshold value σ as determined by a comparator 155. The elements 163 and 165 provide interface functions.

During the communication phase (or firing phase), the neuron generates a read (communication) signal on the axon a via the read generator 162 if the integrated input exceeded the pre-determined threshold value σ during the evaluation phase, and also integrates any electrical signal that it receives on its dendrite d. During the communication phase, the neuron further sends a pulse (bias potential) on the membrane terminal m if the integrated input exceeded the pre-determined threshold value σ during the evaluation phase. The internal counter 151 keeps track of the time elapsed since the moment when the total integrated input exceeds the pre-determined threshold value, after which the counter 151 is reset to zero. The logic elements 156, 157, 158 and 159 collectively provide the membrane terminal m as described herein.

During the programming phase, in a first programming interval, the neuron generates a set pulse on its dendrite d via a set generator 161, if the integrated input exceeded a pre-determined threshold value σ in the evaluation phase. Further, during the first programming interval, the neuron sends an enable pulse of decreasing strength (in amplitude or probability of occurrence depending on the value of the counter 151) on the membrane terminal m, if the integrated input exceeded a pre-determined threshold value σ in the evaluation phase.

In a second programming interval of the programming phase, the neuron generates a reset pulse on its membrane m via a reset generator 160, if the integrated input exceeded a pre-determined threshold value σ in the evaluation phase. Further, during the second programming interval, the neuron sends an enable pulse of decreasing strength on the dendrite d with a probability, depending on the value of the counter 151, if the integrated input exceeds a pre-determined threshold value σ.

Figure 4:
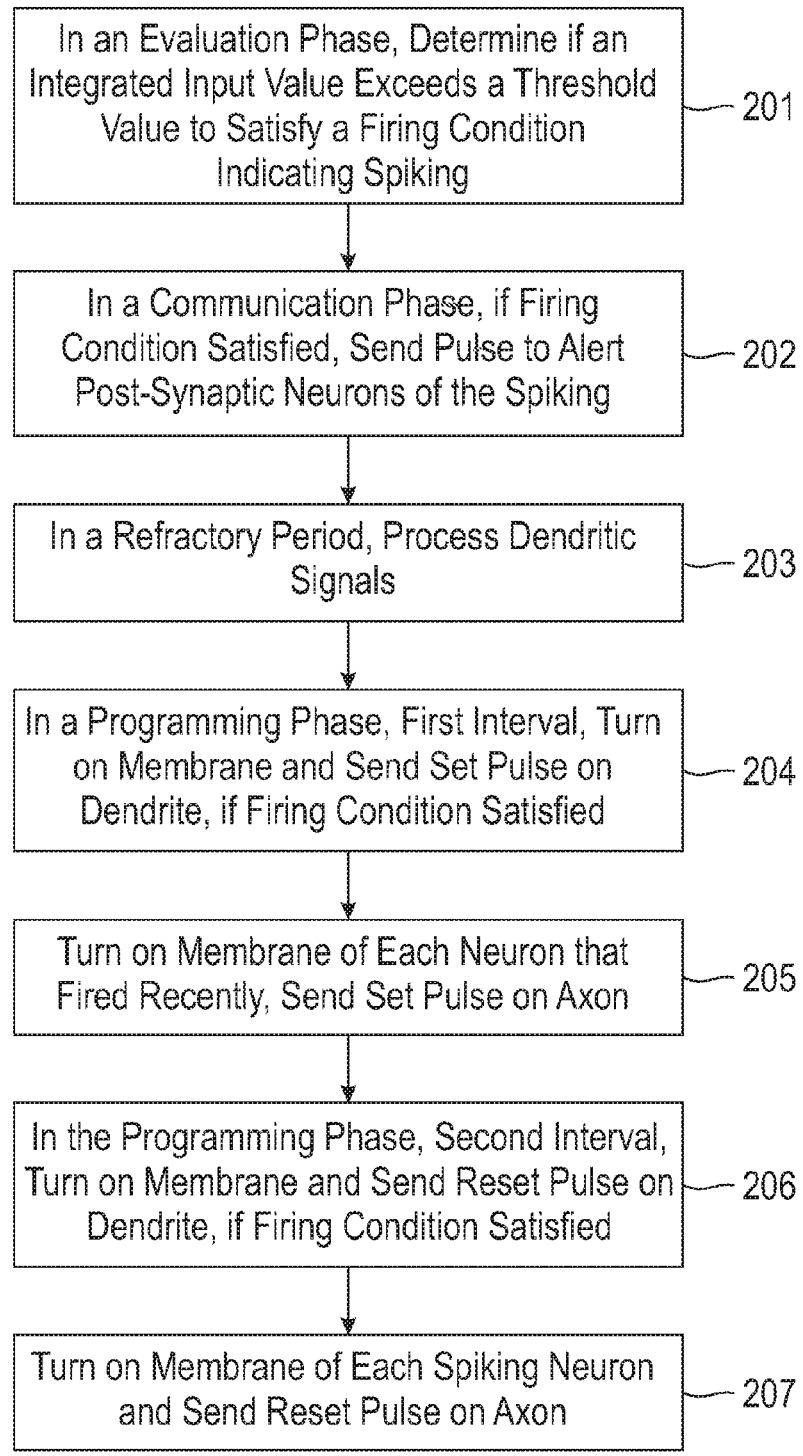
FIG. 4 shows a phased process for producing spike-timing dependent plasticity (STDP) in the neuromorphic network of FIG. 2, in accordance with an embodiment of the invention.

FIG. 4 shows a flowchart of an operation process 200 implemented by the neuromorphic network 100 in FIG. 2 based on the neuron structure in FIG. 3, according to an embodiment of the invention. The process 200 occurs in every cycle for each neuron.

In block 201, in an evaluation phase, the neuron determines if the integrated input value stored in its main memory 153 exceeds the threshold value σ. If the integrated input value exceeds the threshold value, then a firing condition is satisfied, indicating the neuron is spiking.

Figure 5:
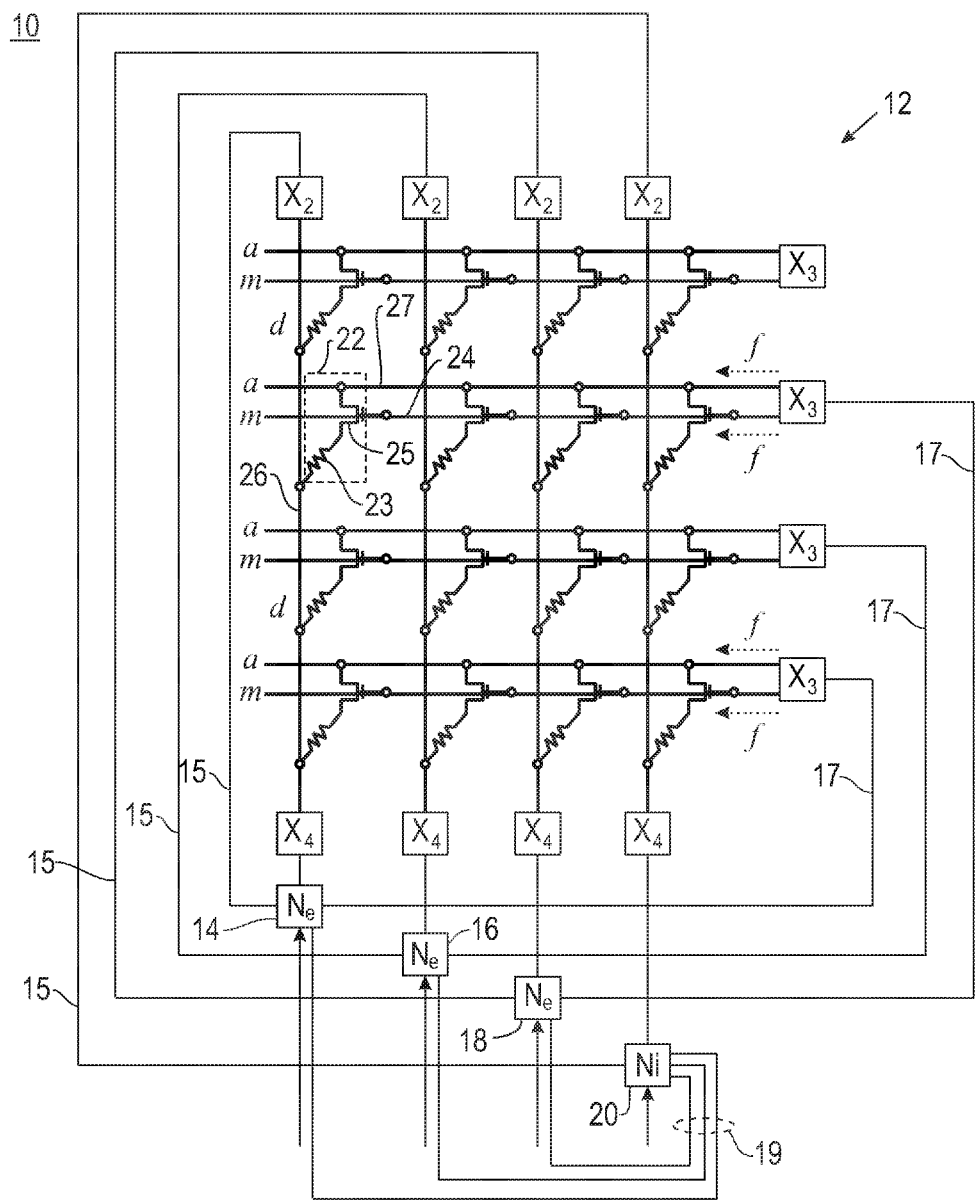
FIG. 5 shows examples of neuron generated signals in the neuromorphic network of FIG. 1, in accordance with an embodiment of the invention.

In block 202, if the firing condition is satisfied in the evaluation phase, a communication phase (read or firing phase) allows all spiking neurons (and only spiking neurons) such as neuron 101 to send a pulse to alert their post-synaptic neurons such as neurons 105, 106, 107, of the spiking event. The alert pulse is in turn used by the receiving post-synaptic neurons for integration. For example, during the communication phase for the neuron 101, the dendrite d is in receive mode, and the axon a is in transmit mode. If the firing condition is satisfied in the evaluation phase, then the neuron 101 turns on its membrane m for a very short time (e.g., in the range of about 10 ns to about 10 ms) and sends a read pulse on its axon a (the membranes m of only the spiking neurons are turned on). Any signal (analog current, which may be digitized by an interface block) at the dendrite d of the neuron 101 (such as from pre-synaptic neurons 102, 103, 104) is received by a memory block 164 (FIG. 3) and stored therein. The source S and drain D terminals of the FETs 25 in the synapses 22 coupled to the axon a and membrane m of the neuron 101, are effectively reversed. FIG. 5 shows coincidence of multiple neurons (e.g., neurons 14 and 18 firing as indicated by dashed arrows f). Multiple small read currents may occur without affecting metal reliability.

Further, the neurons can be stepped through one by one at a quickened pace, essentially a version of Winner Take All (WTA).

In block 203, in a refractory period, data/signals collected at the block 164 are processed by transfer to the input node 154. Arbitrary refractory periods may be selected for the neurons as may be needed.

In block 204, in a first programming interval (i.e., STDP phase 1) of a programming phase, the membrane m is turned on at a strength (probability) based on the value in the counter 151. The firing condition need not be satisfied to turn the membrane on. In one implementation, if the counter value is 0, then membrane potential is 0 (e.g., neuron 101 fired more than about 100 ms ago). Otherwise, the strength (probability) of the membrane potential is inversely proportional to its counter magnitude. If the firing condition is satisfied in the evaluation phase, the neuron 101 sends a set pulse on its dendrite d to the pre-synapse neurons 102, 103, 104. The membranes of all neurons can be turned on all at the same time, or one-by-one (keeping the set pulses from the spiking neurons turned on) to prevent large current flowing out of the dendrites.

Figure 6:
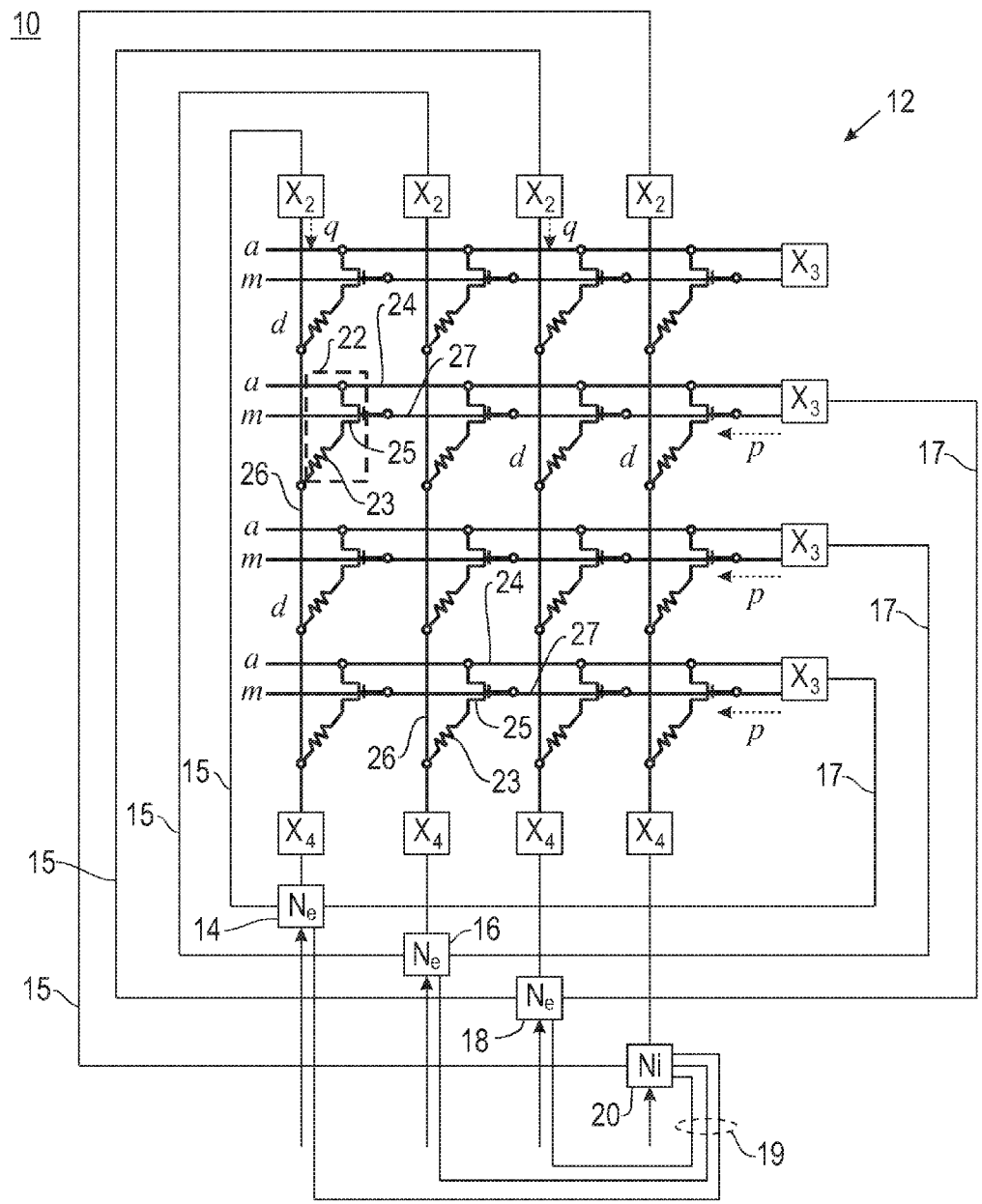
FIG. 6 shows examples of neuron generated programming signals in the neuromorphic network of FIG. 1, in accordance with an embodiment of the invention.

In block 205, as illustrated in FIG. 6, programming of multiple synapses 22 due to signals p on membranes m can coincide. All membranes m corresponding to neurons that fired recently are turned on (with varying strengths). Neurons that just fired, send set pulses (same amplitude) on their axons a. The membranes of all neurons can be turned on all at the same time, or one-by-one (keeping the set pulses from the spiking neurons turned on).

In block 206 in a second programming interval of the programming phase (i.e., STDP phase 2 for reset), if firing condition is satisfied, turn on membrane. Each neuron sends a reset pulse on its dendrite d based on the corresponding counter value. For example, if counter value is 0, membrane potential is 0 (the neuron fired more than 100 ms ago). Otherwise, the strength (probability) of the membrane potential is inversely proportional to its counter magnitude. Only synapses that are connected to a neuron that just fired will actually get programmed. The dendrites of all neurons can be turned on all at the same time, or one-by-one (keeping the set pulses from the spiking neurons turned on) to prevent large current flowing into the axons. For example, in FIG. 2, the dendrites d of the post-synaptic neurons 104, 105 and 106, feed signals into the synapses 22 couples to the membrane m and axon a of the neuron 101.

Figure 7:
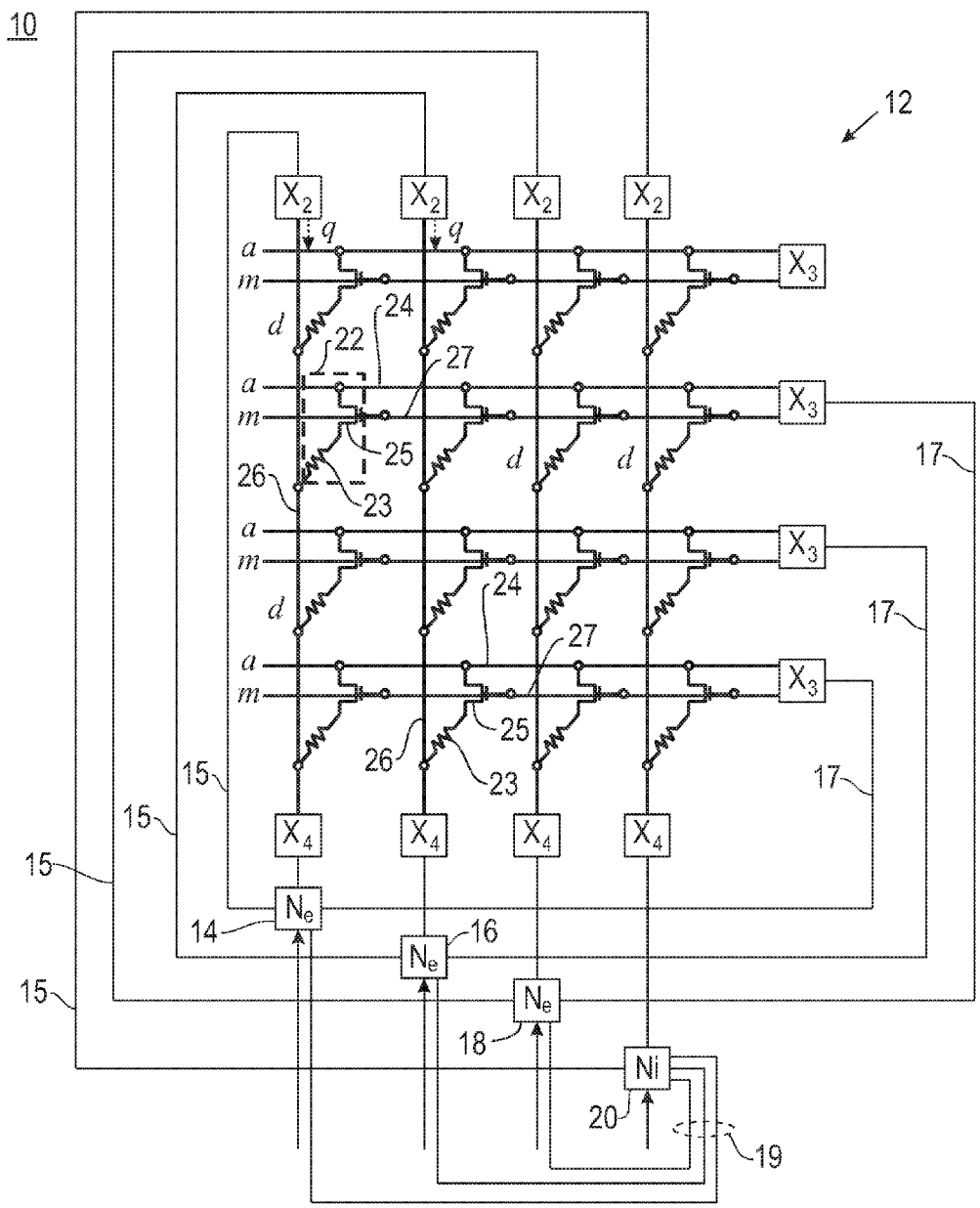
FIG. 7 shows examples of neuron generated programming signals in the neuromorphic network of FIG. 1, in accordance with an embodiment of the invention.

In block 207, as illustrated in FIG. 7, programming of multiple synapses 22 due to signals q on dendrites d can coincide. All membranes m corresponding to neurons that fired recently are turned on (with varying strengths). Neurons that just fired, send set pulses (same amplitude) on their axons a. The membranes of all neurons can be turned on all at the same time, or one-by-one (keeping the set pulses from the spiking neurons turned on).

Figure 8:
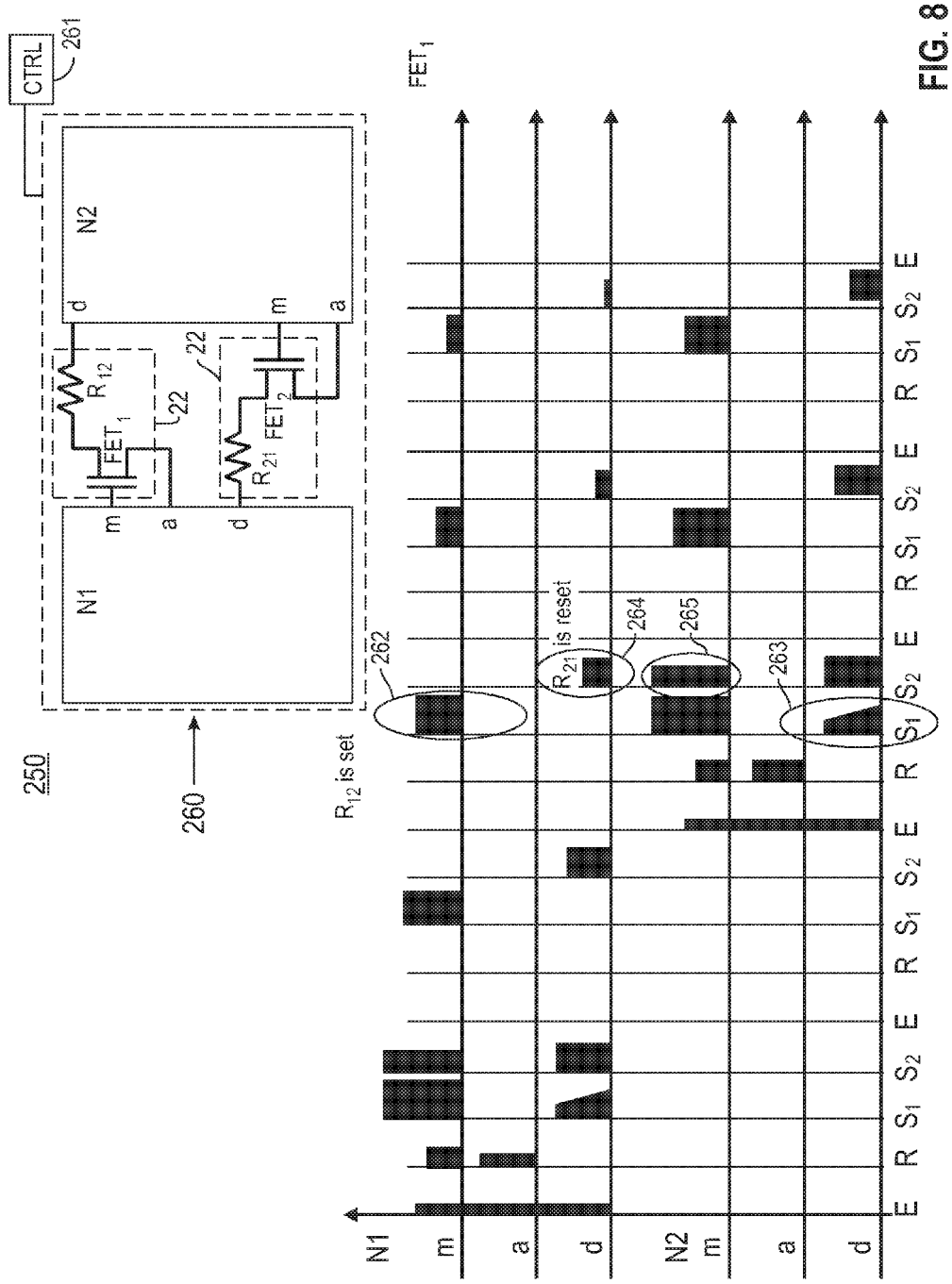
FIG. 8 shows a timing diagram of producing spike-timing dependent plasticity in the neuromorphic network of FIG. 2 in a phased sequence, in accordance with an embodiment of the invention.

FIG. 8 shows a timing diagram 250 of said phases for a circuit 260 comprising two electronic neurons N1 and N2 interconnected via a pair of three terminal electronic synapses 22, wherein timing of evaluation/communication/programming phases are controlled by a timing controller 261 generating global timing reference signals, according to an embodiment of the invention. In one implementation, the controller 261 include may include combinatorial digital logic circuits implementing finite state machines, clock distribution circuits and circuits to implement power gating and clock gating. In one example, the global timing reference signals include the following signals for each neuron of the neurons N1 and N2 (such as the neuron circuit shown in FIG. 3):

Evaluate phase: $\varphi_{eval}$, $\varphi_{compute}$, $\varphi_{refractory}$
Read or Communicate phase: $\varphi_{fire}$
Program phase for SET: $\varphi_{STDP1}$, $\varphi_{STDP2}$
Program phase for RESET: $\varphi_{STDP2}$.

The timing diagram 250 in FIG. 8 shows the neurons N1 and N2 operating in a phased manner according to the global timing reference signals, wherein the action of the neurons is restricted to said phases continuously running phases: evaluate (E), read/communicate (R), program high ($S_1$), program low ($S_2$). Programming phases are for increasing or decreasing the conductance of the programmable resistors $R_{12}$ and $R_{21}$ connected to $FET_1$ and $FET_2$, respectively. Each set of consecutive time phases E, R, $S_1$ and $S_2$ forms a cycle, wherein the cycles repeat. In one example, a typical duration for each of these phases is about 1 microsecond to 100 microseconds.

The timing diagram 250 shows the relative shape and duration of signals during said phases (E, R, $S_1$ and $S_2$) at the membrane (m), axon (a) and dendrite (d) terminals of each of the neuron N1 and N2. In the diagram 250, the horizontal axis indicates time duration of signals during each phase while the vertical axis indicates relative amplitude of the signals. The neurons N1 and N2 may generate signals simultaneously or at different times. However, each neuron can only spike at an E phase, and can only communicate at an R phase and can only generate program signals during $S_1$ and/or $S_2$ phases.

In the example scenario shown in FIG. 8, neuron N1 spikes at a first E phase, while neuron N2 spikes at third subsequent E phase. When neuron N1 spikes, the membrane m is turned on and the axon a is turned on, in the immediate read phase R. Then, at $S_1$ and $S_2$ phases programming signals are sent to membrane and dendrite terminals, m and d, respectively. Programming signals are sent to membrane and dendrite terminals at every $S_1$ and $S_2$ phase for the next 100 ms, but with decreasing amplitude at each membrane and dendrite. This is the rule for implementing a STDP learning rule system.

When neuron N2 spikes at the third E phase, it behaves similar to the neuron N1, wherein at a $S_1$ phase there is signal overlap marked by ellipses 262 and 263 representing signal overlap at N1 membrane and N2 dendrite, respectively. As such, in the two neuron circuit 260, if N1 membrane is turned on and N2 dendrite is turned on, wherein due to switching action of $FET_1$ and $FET_2$ (as controlled by the signal on a, m and d terminals, described above) current flows through resistor $R_{12}$ via $FET_1$ for programming $R_{12}$ (i.e., $R_{12}$ is set). There is no other time in the timing diagram 250 wherein N1 membrane and N2 dendrite have turned on at the same time.

Similarly, in a $S_2$ phase after N2 spikes, the N1 dendrite is turned on and the N2 membrane is turned on. At a S2 phase there is signal overlap marked by ellipses 264 and 265 representing signal overlap at N1 dendrite and N2 membrane, respectively. As such, current flows through the resistor $R_{21}$ via $FET_2$ for programming the resistor $R_{21}$ (i.e., $R_{21}$ is reset). Operation in a phased operation manner, allows generating short duration signals in a neuromorphic network, confined to the phases, wherein action of the signals from different neurons appropriately captures spiking order, and changes the resistances in the synapses between the neurons, according to embodiments of the invention.

Figure 9:
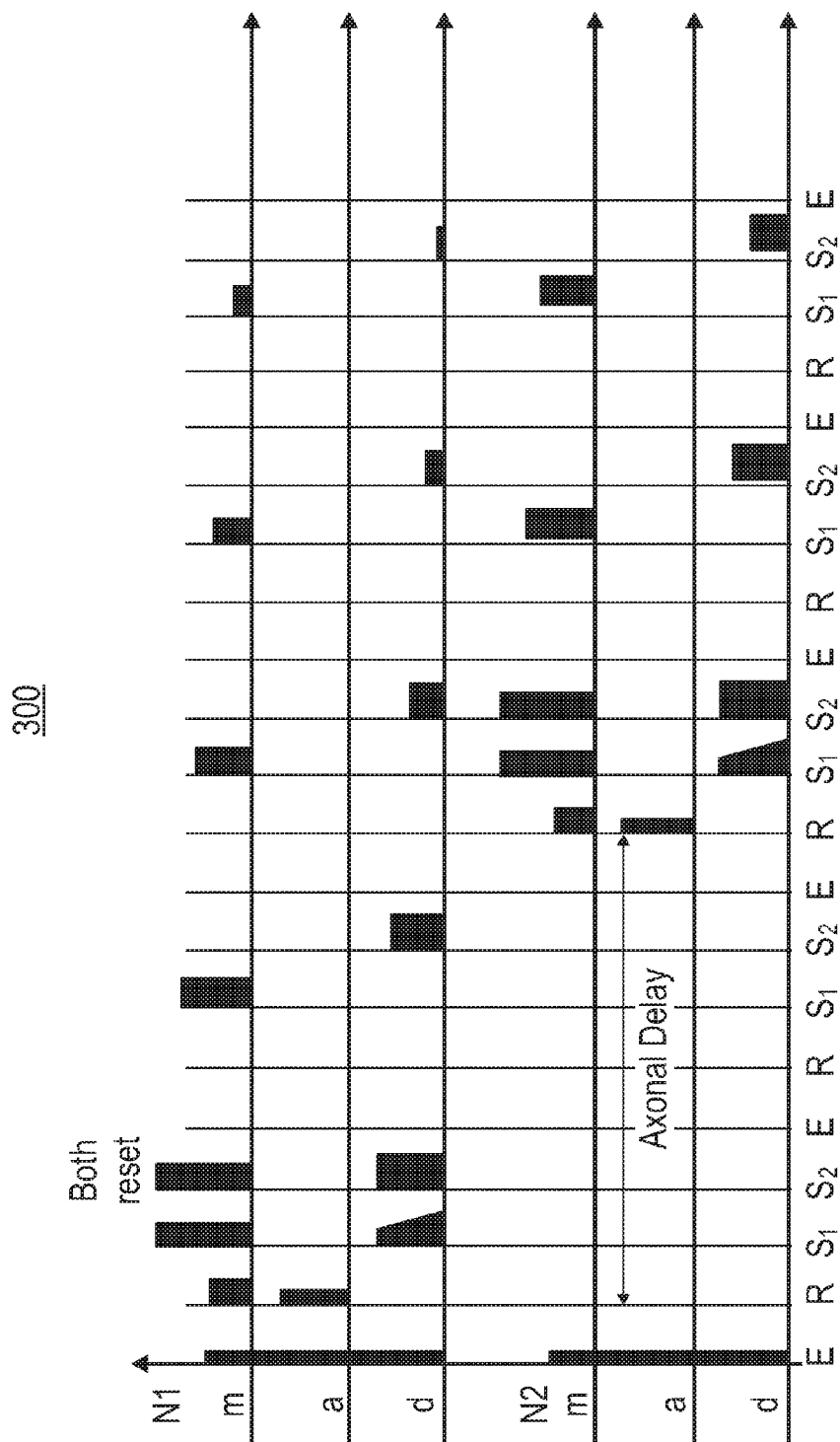
FIG. 9 shows a timing diagram of producing spike-timing dependent plasticity in the neuromorphic network of FIG. 2 in a phased sequence, using axonal delays, in accordance with an embodiment of the invention.

FIG. 9 shows a timing diagram 300 including axonal delays for the two neurons N1 and N2, according to an embodiment of the invention. Axonal delays can be easily introduced in a cycle, wherein signals at terminals m, a, d, appear in a subsequent cycle, instead of the same cycle as the firing event. Such delayed updates may be used to implement more complicated forms of learning.

Figure 10A:
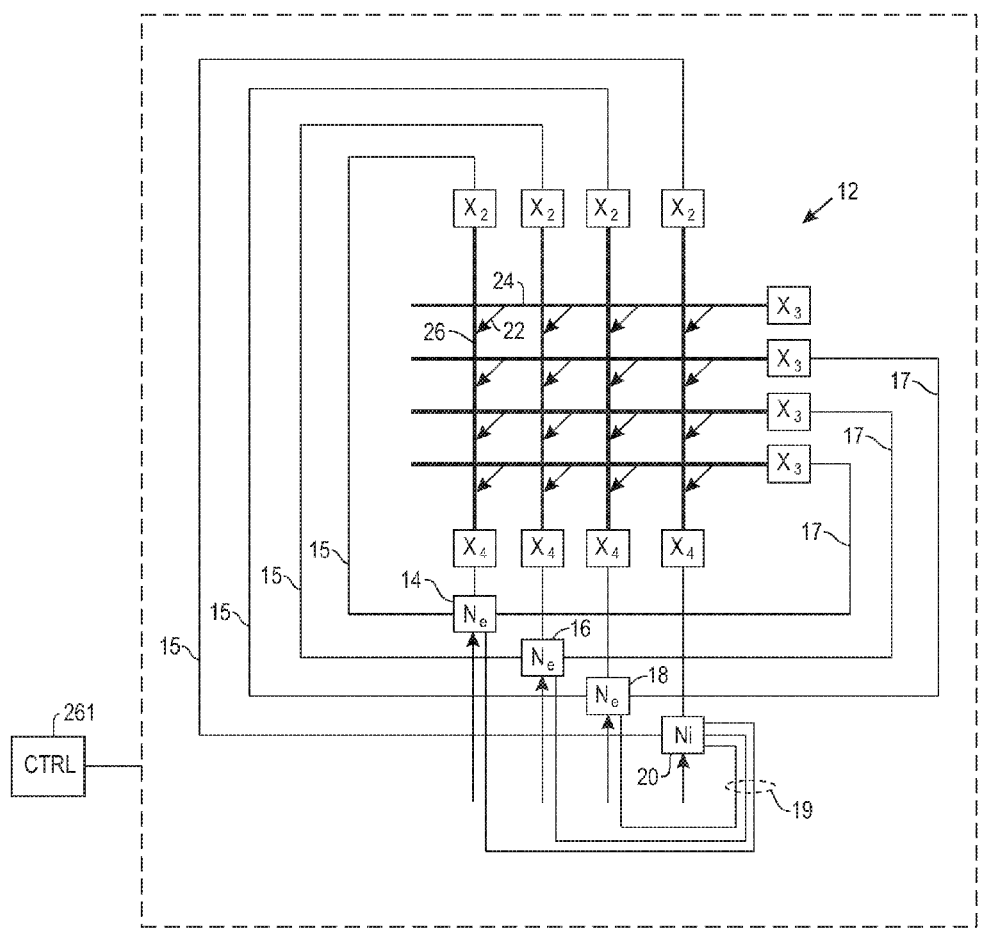
FIG. 10A shows a diagram of a neuromorphic network comprising a probabilistic asynchronous synaptic cross-bar array circuit for spiking computation, in accordance with an embodiment of the invention.

Embodiments of the invention further provide probabilistic asynchronous synaptic networks for utilizing binary stochastic spike-timing-dependent plasticity. According to an embodiment of the invention, a probabilistic asynchronous synaptic network comprises a circuit of spiking electronic neurons providing binary stochastic STDP utilizing synaptic devices comprising binary state memory devices such as binary resistors. Referring to FIG. 10A, in one example implementation of the invention, the probabilistic asynchronous synaptic network comprises a neuromorphic system 500 including an interconnect network such as a synapse cross-bar array 12 interconnecting a plurality of neurons 14, 16, 18 and 20 using synaptic devices 22. The system 500 implements STDP using the synaptic devices 22, wherein each synaptic device 22 comprises a binary state memory device. In one example, the cross-bar array comprises a nano-scale cross-bar array which may have a pitch in the range of about 0.1 nm to 10 μm.

The synapse devices 22 are at the cross-point junctions of the cross-bar array 12, wherein the synapse devices 22 are connected between axons 24 and dendrites 26 such that the axons 24 and dendrites 26 are orthogonal to one another. Embodiments of synaptic devices 22 include binary variable state resistors which implement probability modulated STDP versions. Disclosed embodiments include systems with access devices and systems without access devices.

The synapse devices 22 implement arbitrary and plastic connectivity between the electronic neurons. An access or control device such as a PN diode or a FET wired as a diode (or some other element with a nonlinear voltage-current response), may be connected in series with the variable state resistor at every cross-bar junction to prevent cross-talk during signal communication (neuronal firing events) and to minimize leakage and power consumption; however this is not a necessary condition to achieve synaptic functionality. A PN junction comprises a semiconductor having a P-type area and an N-type area.

In general, in accordance with an embodiment of the invention, neurons "fire" (transmit a pulse) when the integrated inputs they receive from dendritic input connections exceed a threshold. When neurons fire, they maintain an anti-STDP (A-STDP) variable that decays with a relatively long, predetermined, time constant determined by the values of the resistor and capacitor in one of its RC circuits. For example, in one embodiment, this time constant may be 50 ms. The A-STDP variable may be sampled by determining the voltage across the capacitor using a current mirror, or equivalent circuit. This variable is used to achieve axonal STDP, by encoding the time since the last firing of the associated neuron. Axonal STDP is used to control "potentiation", which in this context is defined as increasing synaptic conductance. When neurons fire, they also maintain a dendritic STDP (D-STDP) variable that decays with a relatively long, predetermined, time constant based on the values of the resistor and capacitor in one of its RC circuits. As used herein, the term "when" can mean that a signal is sent instantaneously after a neuron fires, or some period of time after the neuron fires.

The cross-bar array 12 further includes driver devices $X_2$, $X_3$ and $X_4$. The devices $X_2$, $X_3$ and $X_4$ comprise interface driver devices, as described above. The driver devices $X_2$, $X_3$ and $X_4$ comprise CMOS logic circuits.

In this example, each of the excitatory neurons 14, 16, 18 ($N_e$) is configured to provide integration and firing. Each inhibitory neuron 20 ($N_i$) is configured to regulate the activity of the excitatory neurons depending on overall network activity. The exact number of excitatory neurons and inhibitory neurons can vary depending on the structure of the problem. The synapse devices 22 implement synapses with spike-timing based learning. When a neuron spikes, it sends spike signals to interface drivers $X_2$ and $X_3$.

Figure 10B:
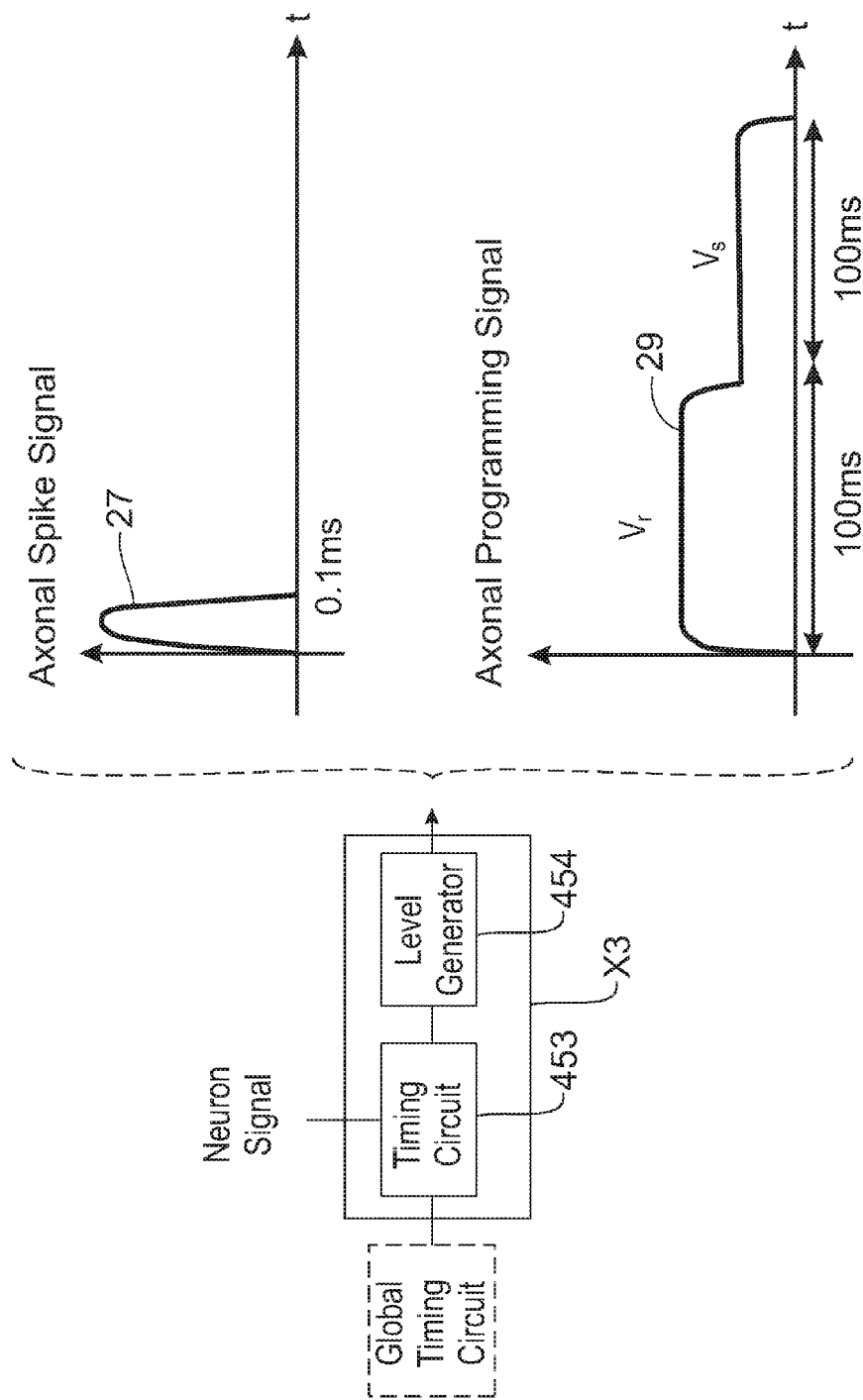
FIG. 10B shows a diagram of an axon driver in a probabilistic asynchronous synaptic cross-bar array circuit for spiking computation, in accordance with an embodiment of the invention.

As shown by example in FIG. 10B, in one embodiment, an axon driver $X_3$ comprises a timing circuit 453 and a level generator circuit 454. When the driver $X_3$ receives a spike signal from a neuron, the level generator circuit 454 of the driver $X_3$ generates axonal signals. In one example, such an axonal signal comprises an axonal spike signal about 0.1 ms long used for forward communication of the neuron spike signal. The spike signal creates a voltage bias across a corresponding synaptic device 22 (FIG. 10A), resulting in a current flow into downstream neurons, such that the magnitude of the current is weighted by the conductance of the corresponding synaptic device 22.

A subsequent axonal signal by the level generator circuit 454 comprises a pulse about 200 ms long for implementing programming of the synaptic device 22 at the cross-point junction for the drivers $X_2$ and $X_3$. This signal functions to increase or decrease conductance of synaptic device 22 at a cross-point junction coupling the axon driver $X_3$ and the dendrite driver $X_2$, as a function of time since a last spiking of the electronic neuron firing a spiking signal into the axon driver $X_3$ and the dendrite driver $X_2$.

Figure 10C:
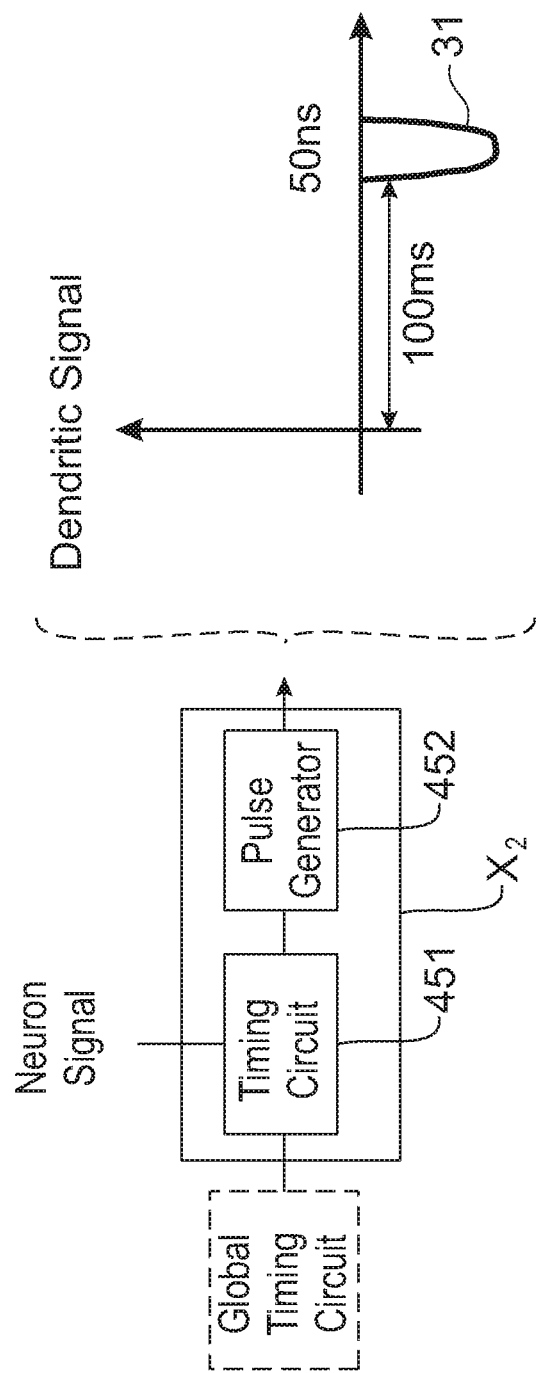
FIG. 10C shows a diagram of a dendrite driver in a probabilistic asynchronous synaptic cross-bar array circuit for spiking computation, in accordance with an embodiment of the invention.

As shown by example in FIG. 10C, in one embodiment, a dendrite driver $X_2$ comprises a timing circuit 451 and a pulse generator circuit 452. Upon receiving said spike from a neuron, at the end of a delay period, the pulse generator circuit 452 generates a dendrite spike signal. In the example shown in FIG. 10C, when the dendrite driver $X_2$ receives a spike signal from a neuron, in one example after a delay (e.g., about 50 ms to 150 ms and preferably about 100 ms long) the driver $X_2$ generates a dendritic spike signal (e.g., about 45 ns to 55 ns and preferably about 50 ns long).

In general, the combined action of the signals from driver devices $X_2$ and $X_3$ in response to spiking signals from the firing neurons in the cross-bar array 12, causes the corresponding synaptic devices 22 at the cross-bar array junctions thereof, to change value based on the spiking timing action of the firing neurons. This provides programming of the synaptic devices 22.

For a given synaptic device 22, the magnitude of the voltage pulses generated by corresponding drivers $X_2$ and $X_3$ are selected such that the current flow through the synaptic device 22 due to the activity of only one among the drivers $X_2$ and $X_3$ is insufficient to program the synaptic device 22.

Figure 10D:
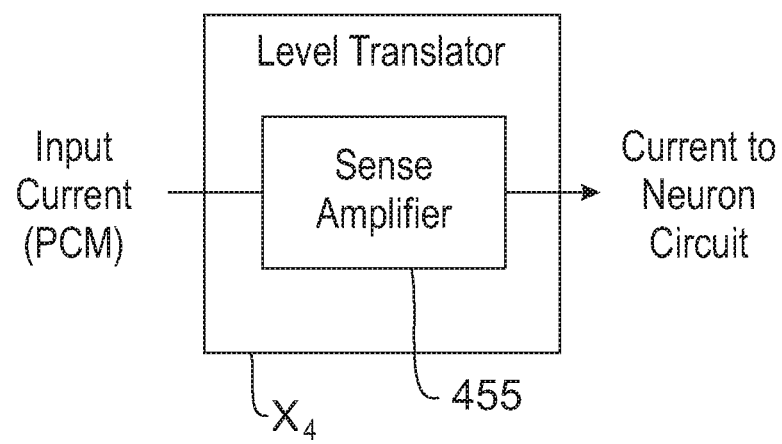
FIG. 10D shows a diagram of a level driver in a probabilistic asynchronous synaptic cross-bar array circuit for spiking computation, in accordance with an embodiment of the invention.

As shown by example in FIG. 10D, for a digital implementation of a neuron, in one embodiment a level translator device $X_4$ comprises a sense amplifier 455 for accomplishing the same function. In one example, each level translator device $X_4$ translates PCM currents wherein a PCM ON current of about 10 µA is translated to about 10 nA, and a PCM OFF current of about 100 nA is translated to about 100 pA. Further, level translators $X_4$ prevent integration of programming current by blocking any current flow in a neuron when a corresponding driver $X_2$ is active.

The timing in delivering signals from the neurons in the cross-bar array 12 to the driver devices $X_2$, $X_3$, $X_4$, and the timing of the driver devices $X_2$, $X_3$, $X_4$ in generating signals, allows programming of the synaptic devices 22. One implementation comprises changing the state of synaptic devices 22 by increasing or decreasing conductance of the variable state resistor therein as a function of time since a last spiking of an electronic neuron firing a spiking signal into the axon driver and the dendrite driver coupled by the variable state resistor. In general, neurons generate spike signals and the devices $X_2$, $X_3$, $X_4$ interpret the spikes signals, and in response generate signals described above for programming the synaptic devices 22.

Figure 11:
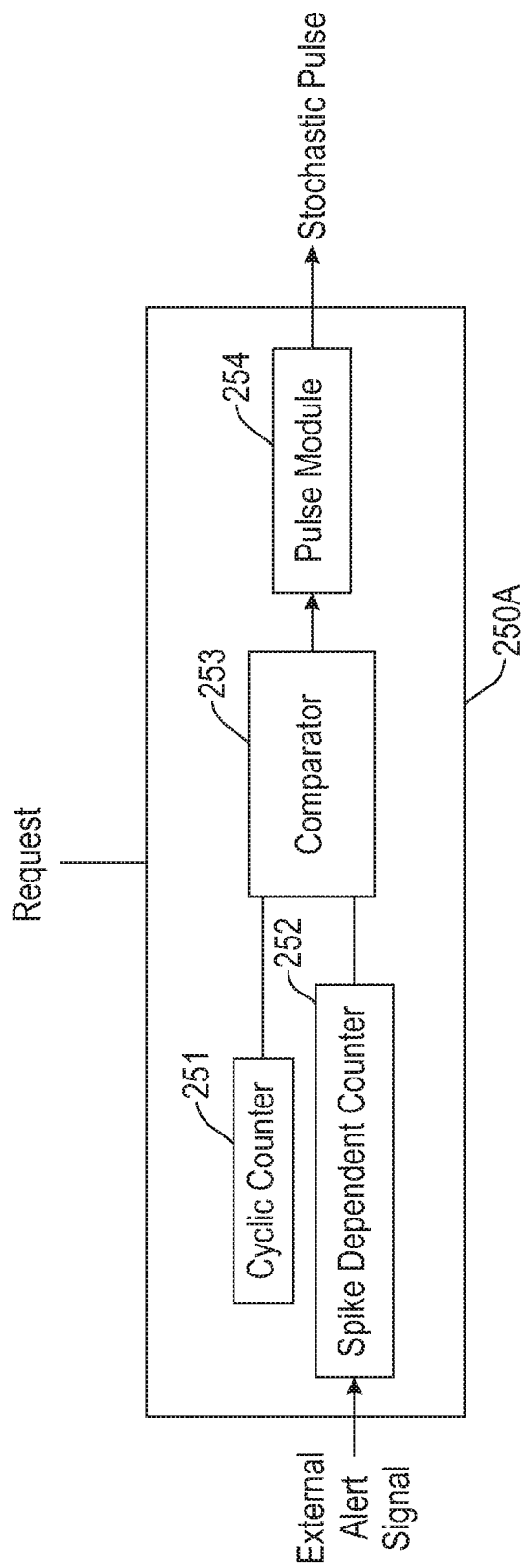
FIG. 11 shows a stochastic signal generator for the network of FIG. 10A, in accordance with an embodiment of the invention.

Each driver circuit $X_2$ and $X_3$ includes a stochastic signal generator 250A shown in FIG. 11 that generates a signal with a probability of occurrence that decays as a function of the time elapsed since the last spiking of a corresponding electronic neuron. The stochastic signal generator 250A comprises a cyclic counter 251 that is constantly updating its value (i.e., always-on counter), a spike dependent counter 252 that is initiated when an external alter signal (such as neuron spiking signal) is received, and a comparator 253 that compares the value of the spike dependent counter to the value of the cyclic counter upon receiving a request signal. If the value of the spike dependent counter is greater than the value of the cyclic counter, the comparator 253 causes a pulse module 254 to generate a stochastic binary enable pulse. The term "binary" means that each pulse is being used to represent one of two possible data values.

Figure 12:
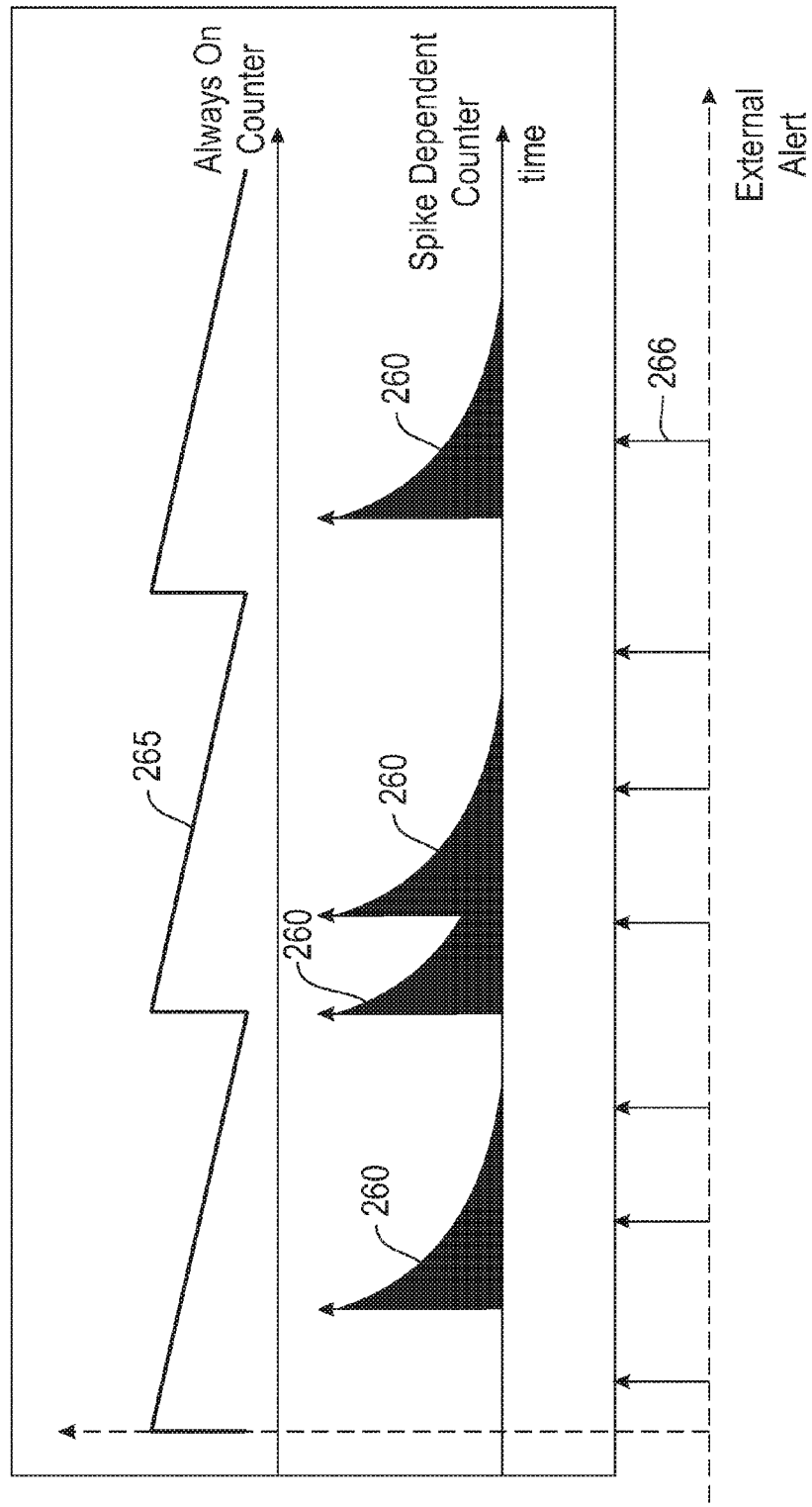
FIG. 12 shows a graph of signal output for a cyclic counter and a spike dependent counter in the stochastic signal generator of FIG. 11, in accordance with an embodiment of the invention.

The binary pulse is generated with a probability that decays with the time elapsed since the last alert signal such as a neuron spiking event. When the spike dependent counter 252 receives an alert signal such as a spike signal from an electronic neuron, the spike dependent counter 252 charges an internal "memory" capacitor to $V_0$, wherein the potential across the capacitor decays according to $V_t = V_0 e^{-t/RC}$, with RC=100 ms as indicated by graphs 260 in FIG. 12, representing value of the counter 252 over time. The electronic neuron can spike again before the 100 ms has expired, wherein the spike dependent counter 252 charges the internal capacitor again before its charge has fully decayed. FIG. 12 further shows graph 265 representing value of the cyclic counter 251 over time. In this example, the cyclic counter 251 comprises a down counter which counts down to zero from an initial value, and is repeatedly reinitialized to the initial value for counting down to zero. In FIG. 12, the set of arrows 266 corresponds to the times when the neuron is receiving signals from other neurons to respond with a probabilistic signal. The arrows 266 further indicate timing signals for the $S_1$ and S2 phases.

Figure 13:
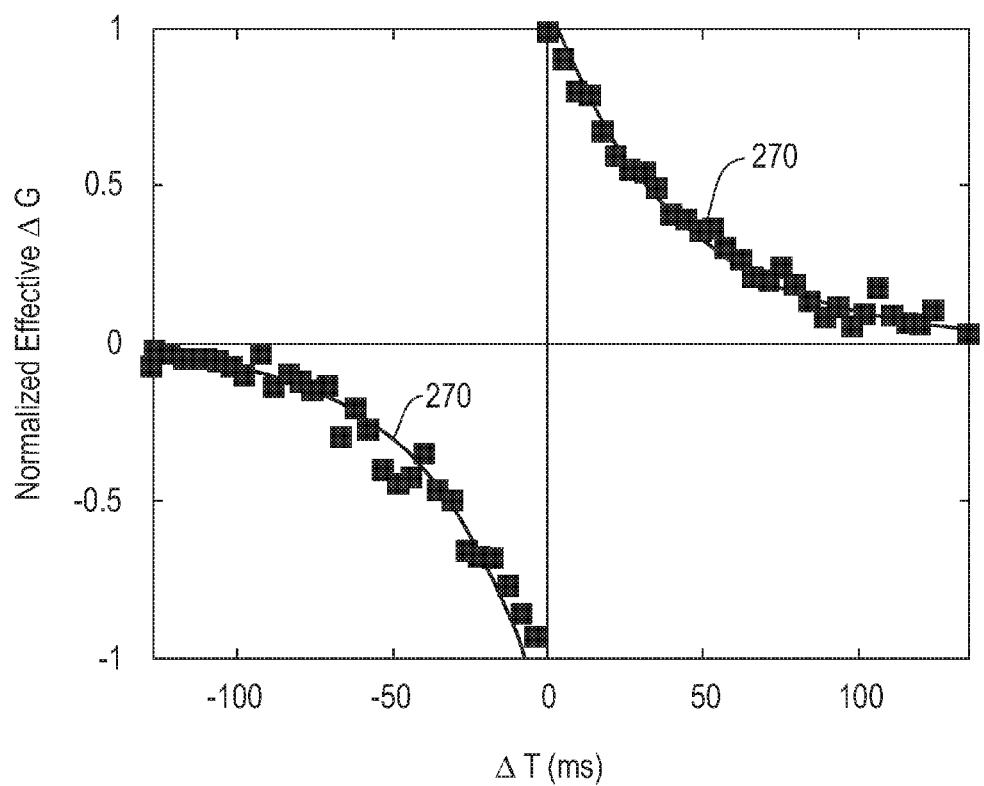
FIG. 13 shows an example spike-timing-dependent plasticity probability graph, in accordance with an embodiment of the invention.

The binary pulse from the stochastic signal generator 250A programs a corresponding synapse device 22 including a binary state device (fully ON, fully OFF) at a cross-point junction of the array 12, to implement probabilistic binary STDP. The synapse device 22 is turned ON/OFF based on a probability represented by an example STDP graph 270 illustrated in FIG. 13. The synapse device 22 includes a memory device with two states, wherein the state of the memory device is changed probabilistically based on the pulse from the stochastic signal generator 250A. FIG. 13 shows the probability of changing state of the memory device in the synapse device 22 (vertical axis), normalized by the minimum between before and after state of synapse device 22, as a function of the timing between neuronal firing (horizontal axis).

A timing signal generator 261 (FIG. 10A) generates a global timing reference signal, wherein action of the electronic neurons at any instant in time is determined by the timing signal. The action of the neurons comprise: evaluate, communicate, two programming steps to decrease or increase synaptic resistance, and two measuring steps for measuring the number of ON bits on the neuron axon and dendrite.

The example implementation of the invention in FIG. 1 utilizes binary resistors in the synapses 22. An example binary resistor comprises a resistor that exhibits two different resistances (e.g., Resistive random-access memory (RRAM)). In another implementation of the invention, CMOS electronic neurons interact with each other through nano-scale memory synapses 22 such as PCM circuits. A spiking electronic neuron integrates inputs from other neurons through programmable PCM synapses 22, and spikes when the integrated input exceeds a pre-determined threshold. In the binary probabilistic STDP implementation described herein, each electronic neuron remembers its last spiking event using a simple RC circuit. Thus, when an electronic neuron spikes, several events occur, as described below. In one example, the spiking neuron charges an internal "memory" capacitor to $V_0$, wherein the potential across the capacitor decays according to $V_t = V_0 e^{-t/RC}$, with RC=50 ms.

The spiking neuron sends a nanosecond "alert" pulse on its axons and dendrites. If the alert pulse generated at the axon is a voltage spike, then downstream neurons receive a current signal, weighted by the conductance of a PCM synapse between each pair of involved neurons (which can then be integrated by the downstream neurons). The alert pulse generated at the dendrite is not integrated by upstream neurons, but serves as a hand-shake signal, relaying information to those neurons indicating that a programming pulse for the synapses is imminent.

An implementation of the cross-bar array 12 in FIG. 1 is as shown in FIG. 1 and described above. Each synapse device 22 comprises resistors 23 at cross-point junctions of the array, employed to implement arbitrary and plastic connectivity between said electronic neurons. Each synapse device 22 further comprises an access or control device 25 comprising a FET which is not wired as a diode, at every cross-point junction to prevent cross-talk during signal communication (neuronal firing events) and to minimize leakage and power consumption.

The FET driven PCM synaptic devices 22 implement STDP in a time phased fashion. In one embodiment of the invention, synaptic weight updates and communication in the neuromorphic network 500 (FIG. 10A) are restricted to specific phases of a global timing reference signal (i.e., global clock), to achieve STDP.

The combined action of the signals from drivers $X_2$ and $X_3$ in response to spiking signals from the firing neurons in the cross-bar array 12, causes the corresponding resistors 23 in synapses 22 at the cross-bar array junctions thereof, to change value based on the spiking timing action of the firing neurons. This provides programming of the resistors 23. The magnitude of the voltage pulses generated by interface drivers $X_2$ and $X_3$ are selected such that the current flow through the synaptic element due to the activity of only one among them is not sufficient to program the synaptic element.

In an analog implementation of a neuron, each level translator device $X_4$ comprises a circuit configured to translate the amount of current from each corresponding synapse 22 for integration by the corresponding neuron. For a digital implementation of a neuron, each level translator device $X_4$ comprises a sense amplifier for accomplishing the same function. In one example, each level translator device $X_4$ translates PCM currents, wherein a PCM ON current of about 10 $\mu$A is translated to about 10 nA, and a PCM OFF current of about 100 nA is translated to about 100 pA. Further, level translators $X_4$ prevent integration of programming current by blocking any current flow in a neuron when driver $X_2$ is active.

In one example, a read spike of a short duration (e.g., about 0.1 ms long) is generated by the axon driver device $X_3$ for communication based on the function of the stochastic signal generator 250A therein in response to the spiking signal from the associated neuron. An elongated pulse (e.g., about 200 ms long) is generated by the axon driver device $X_3$ based on the function of the stochastic signal generator 250A therein in response the spiking signal from the associated neuron. A short negative pulse (e.g., about 50 ns long) is generated by the dendrite driver device $X_2$ based on the function of the stochastic signal generator 250A therein after a period of 100 ms has elapsed since it received the spiking signal from the associated neuron. As such, the axon driver device $X_3$ provides a long programming pulse and communication spikes.

The architecture 100 in FIG. 2 is useful with the system 500 of FIG. 10A. In architecture 100, the drivers $X_2$, $X_3$, $X_4$ are assumed to be internal components of the neurons, and as such are not shown for simplicity of presentation. According to an embodiment of the invention, stochastic signals for programming the synapses are generated by $X_2$ and $X_3$ drivers. The neurons comprise CMOS circuits for integrate-and-fire functions to implement binary probabilistic STDP in synapses 22.

The FET driven PCM synaptic devices 22 implement binary stochastic STDP in a time phased fashion. Spiking of neurons are restricted to certain time phases based on a global timing reference signal (i.e., controller 261 in FIG. 10A), providing programming activity in synapses that are phased. In the network 100, the function of each neuron at any instant in time is determined by the global timing reference signal. The functions of the neuron comprise an evaluation phase, a communication phase and a programming phase. The programming phase includes two programming intervals intended to decrease or increase the resistance of a synapse. A set of evaluation, communication and programming phases in order form a cycle, and the cycles repeat one after another. The timing of the phases and cycles are controlled by a timing controller providing a global timing reference signal.

The architecture 150 in FIG. 3 is useful with the system 500 of FIG. 10A. Function of the neurons at any instant in time is determined by the global timing reference signal. Each neuron includes an internal counter 151 that keeps track of the time elapsed since the moment of last firing event of the neuron. A summer 152 and memory 153 are configured to essentially integrate input from a node 154.

Figure 14:
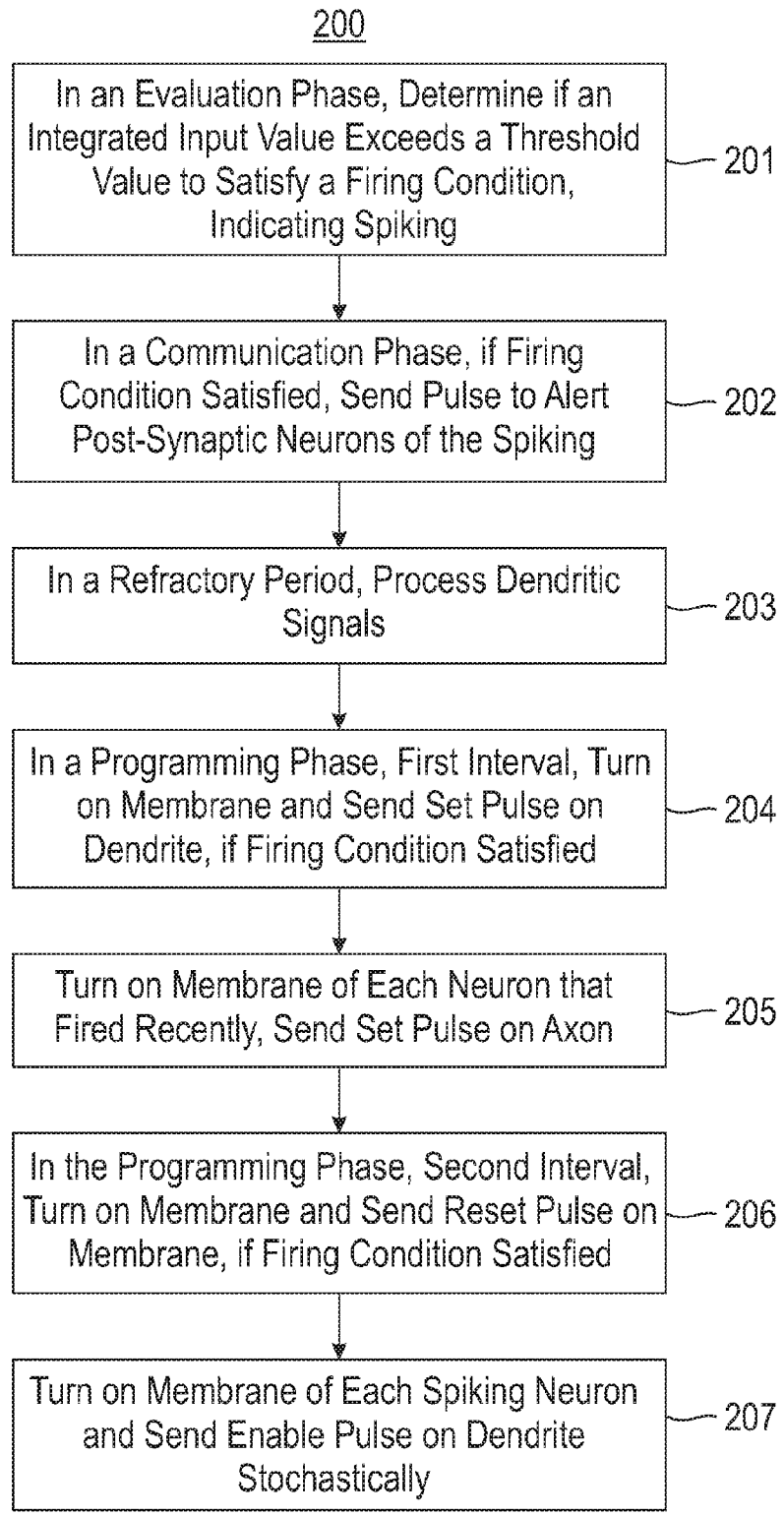
FIG. 14 shows a flowchart of a phased process for producing spike-timing dependent plasticity in the neuromorphic network of FIG. 13, in accordance with an embodiment of the invention.

FIG. 14 shows a flowchart of an operation process 200 in the system 500 for the phases implemented by the neuromorphic network in FIG. 1 based on the neuron structure in FIG. 3, according to an embodiment of the invention. In block 201, during the evaluation phase (E), the neuron determines if the total integrated input in its main memory 153 exceeds a pre-determined threshold value σ as determined by a comparator 155.

In block 202, during the communication phase or firing phase (R), the neuron generates a read (communication) signal on the axon a via the read generator 162 if the integrated input exceeded the pre-determined threshold value σ during the evaluation phase, and also integrates any electrical signal that it receives on its dendrite d. During the communication phase, the neuron further sends a pulse (bias potential) on its membrane terminal if the integrated input exceeded the pre-determined threshold value σ during the evaluation phase. The internal counter 151 keeps track of the time elapsed since the moment when the total integrated input exceeds the pre-determined threshold value, after which the counter 151 is reset to zero. During the communication phase, all dendrites are in receive mode and the axon of the firing neuron is in transmit mode (all other axons are inactive). The $X_3$ driver (FIG. 1) of the firing neuron turns on its membrane m, and sends a spike on its axon a. The $X_4$ driver determines magnitude of incoming signals using an analog-to-digital converter (ADC) or a current converter. A certain amount of current flow into all $X_4$ drivers depending on the conductance of an associated cross-point junction synapse.

For example, in an operation scenario in FIG. 2, if the firing condition is satisfied in the evaluation phase, the communication phase allows all spiking neurons, such as neuron 101 to send a pulse to alert their post-synaptic neurons such as neurons 105, 106, 107, of the spiking event. The alert pulse is in turn used by the receiving post-synaptic neurons for integration. For example, during the communication phase for the neuron 101, the dendrite d is in receive mode, and the axon a is in transmit mode. If the firing condition is satisfied in the evaluation phase, then the neuron 101 turns on its membrane m for a very short time and sends a read pulse on its axon a (the membranes m of only the spiking neurons are turned on). Any signal (analog current, which may be digitized by an interface block) at the dendrite d of the neuron 101 (such as from pre-synaptic neurons 102, 103, 104) is received by the memory block 164 and stored therein. The source S and drain D terminals of the FETs 25 in the synapses 22 coupled to the axon a and membrane m of the neuron 101, are effectively reversed.

Further, the neurons can be stepped through one by one at a quickened pace, essentially a version of Winner Take All (WTA) mechanism using nonlinear inhibition to select a largest input among of a set of inputs. Generally, in WTA, output nodes in the neuromorphic network mutually inhibit each other and activate themselves via reflexive connections. As a result, only an output node corresponding to the strongest input remains active.

Referring to FIG. 14, in block 203, in a refractory period, data/signals collected at the block 164 are processed by transfer to the input node 154 (FIG. 3). Arbitrary refractory periods may be selected for the neurons as may be needed.

In block 204, during the programming phase, in a first programming interval ($S_1$), the $X_2$ driver (FIG. 1) associated with (connected to) the firing neuron generates a set pulse on its dendrite d based on a pulse from a set generator 161 in the firing neuron, if the integrated input exceeded a pre-determined threshold value σ in the evaluation phase.

In block 205, programming of multiple synapses 22 due to signals on membranes m can coincide. All membranes m corresponding to neurons that fired recently are turned on (with varying strengths). Neurons that just fired, send set pulses (via associated $X_2$ driver) on their axons a. The membranes of all neurons can be turned on all at the same time, or one-by-one (keeping the set pulses from the spiking neurons turned on).

Further, during the first programming interval, the firing neuron sends an enable pulse of decreasing strength, if the integrated input exceeded a pre-determined threshold value σ in the evaluation phase. In response, the $X_3$ driver associated with the firing neuron sends an enable pulse on its membrane terminal m stochastically (based on the function of the stochastic signal generator 250A therein). The stochastic response of the $X_3$ driver is because of the fact that the spike dependent counter of each $X_3$ driver must have spiked in the past at different time instants.

For example, in an operation scenario in FIG. 2, in a first programming interval ($S_1$) of a programming phase, the membrane m of the neuron 101 is turned on at a strength (probability) based on the value in the counter 151. In one implementation, if the counter value is 0, then membrane potential is 0 (e.g., neuron 101 fired more than about 100 ms ago). Otherwise, the strength (probability) of the membrane potential is inversely proportional to its counter magnitude. If the firing condition is satisfied in the evaluation phase, the neuron 101 sends a set pulse on its dendrite d to the pre-synapse neurons 102, 103, 104. The membranes of all neurons can be turned on all at the same time, or one-by-one (keeping the set pulses from the spiking neurons turned on) to prevent large current flowing out of the dendrites.

Referring back to FIG. 14, in block 206, in a second programming interval ($S_2$) of the programming, the firing neuron generates a reset pulse via a reset generator 160 (FIG. 3), if the integrated input exceeded a pre-determined threshold value σ in the evaluation phase. In response, the $X_3$ driver (FIG. 1) associated with the firing neuron sends a reset pulse on its membrane m.

In block 207, further during the second programming interval, the firing neuron sends an enable pulse of decreasing strength depending on the value of the counter 151, if the integrated input exceeds a pre-determined threshold value σ. In response, the $X_2$ driver associated with the firing neuron sends an enable pulse on its dendrite d stochastically (based on the function of the stochastic signal generator 250A therein). The stochastic response of the $X_2$ driver is because of the fact that the spike dependent counter of each $X_2$ driver must have spiked in the past at different time instants.

According to an embodiment of the invention, in a dendritic loading phase, the dendrite of the spiking neuron is in receive mode, axons of all neurons are in transmit mode, and all other dendrites are inactive. Each neuron turns on its membrane, sends a spike on its axon via an associated $X_3$ driver, wherein a certain amount of current flows into associated $X_4$ drivers depending on the conductance of the associated synapses. This action may be repeated across all $X_3$ drivers. In an axon loading phase, incoming current at all $X_4$ drivers is integrated using adding circuits.

Figure 15:
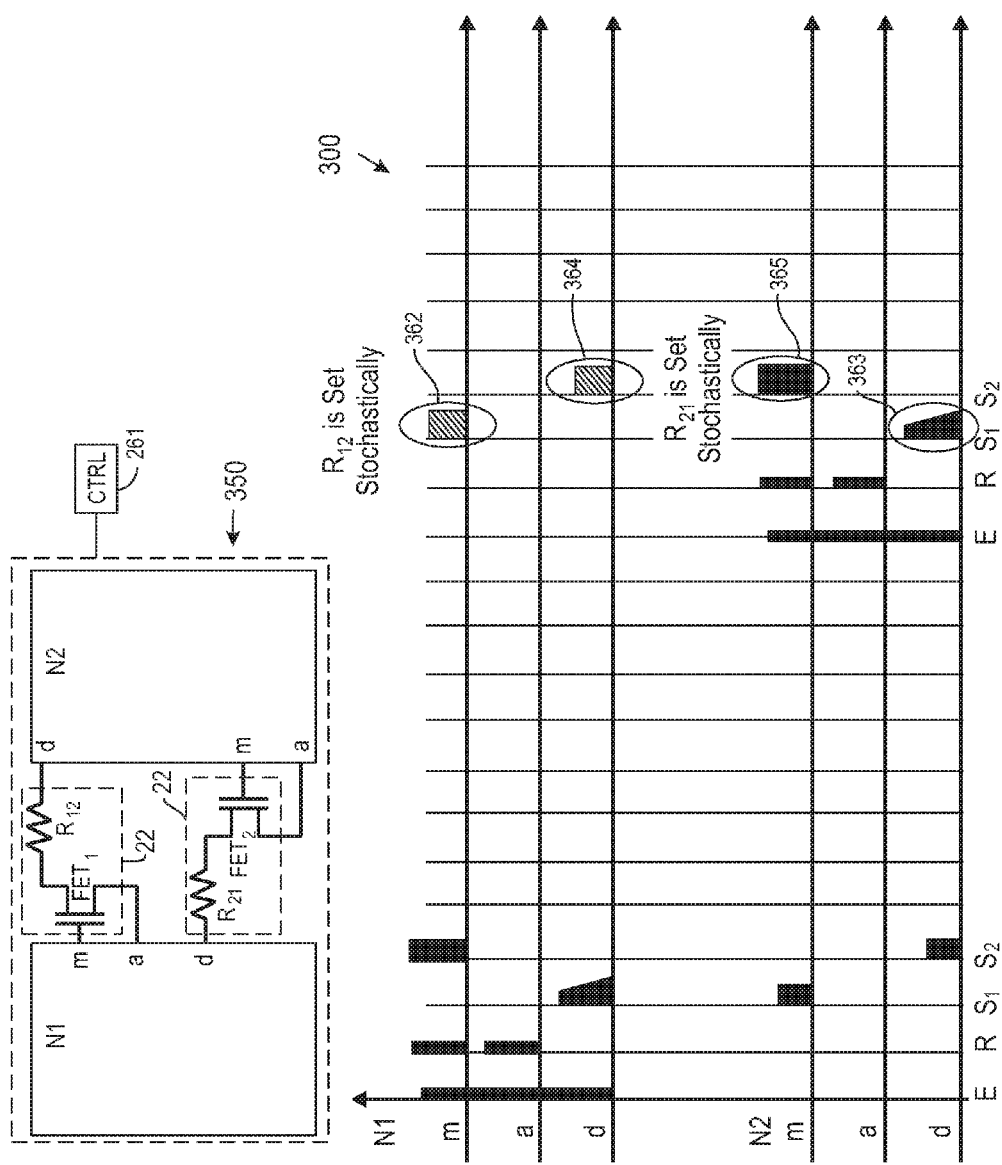
FIG. 15 shows a timing diagram of producing spike-timing dependent probabilistic asynchronous PCM synaptic plasticity in the neuromorphic network of FIG. 13 in a phased sequence, in accordance with an embodiment of the invention.

FIG. 15 shows a timing diagram 300 of said phases for a circuit 350 comprising two electronic neurons N1 and N2 interconnected via a pair of three terminal electronic synapses 22, wherein timing of evaluation/communication/programming phases are controlled by a timing controller 261 generating global timing reference signals, according to an embodiment of the invention. In one example, the global timing reference signals include the following signals for each neuron of the neurons N1 and N2 (such as the neuron circuit shown in FIG. 3):

Evaluate phase: $\varphi_{eval}$, $\varphi_{compute}$, $\varphi_{refractory}$
Read or Communicate phase: $\varphi_{fire}$
Program phase for SET: $\varphi_{STDP1}$, $\varphi_{STDP2}$
Program phase for RESET: $\varphi_{STDP2}$.

The timing diagram 300 in FIG. 15 shows the neurons N1 and N2 operating in a phased manner according to the global timing reference signals wherein the action of the neurons is restricted to said phases continuously running phases: evaluate (E), read/communicate (R), program high ($S_1$), program low ($S_2$). Programming phases are for increasing or decreasing the conductance of the programmable resistors $R_{12}$ and $R_{21}$ connected to $FET_1$ and $FET_2$, respectively. Each set of consecutive time phases E, R, $S_1$ and $S_2$ forms a cycle, wherein the cycles repeat. In one example, a typical duration for each of these phases is about 1 microsecond to 100 microseconds.

The timing diagram 300 shows the relative shape and duration of signals during said phases (E, R, $S_1$ and $S_2$) at the membrane (m), axon (a) and dendrite (d) terminals of each of the neurons N1 and N2. In the diagram 300, the horizontal axis indicates time duration of signals during each phase while the vertical axis indicates relative amplitude of the signals. The neurons N1 and N2 may generate signals simultaneously or at different times. However, each neuron can only spike at an E phase, and can only communicate at an R phase and can only generate program signals during $S_1$ and/or $S_2$ phases.

In the example scenario shown in FIG. 15, neuron N1 spikes at a first E phase, while neuron N2 spikes at third subsequent E phase. Neuron N1 spikes during a first E phase. In a first R phase, signals are sent on a and m terminals. At first $S_1$ and $S_2$ phases, signals are sent on m and d terminals, respectively. For the next 100 ms, the $S_1$ and $S_2$ phase signals are sent with same amplitude, but with decreasing probability. The amplitude of the signal generated by N1 at $S_1$ and $S_2$ is the same during successive $S_1$ and $S_2$ periods, only the probability of the signal being generated is decreasing.

When neuron N1 spikes, the membrane m is turned on and the axon a is turned on, in the immediate read phase R. Then, at $S_1$ and $S_2$ phases programming signals are sent to membrane and dendrite terminals, m and d, respectively. Programming signals are sent to membrane and dendrite terminals at every $S_1$ and $S_2$ phase for the next 100 ms, but with stochastic probability at each membrane and dendrite.

This is the rule for implementing binary stochastic STDP according to an embodiment of the invention. Hash marks indicate stochastic signals generated by $X_2$ and $X_3$ drivers associated with a firing neuron, as described above. In the description herein, programming signals during $S_1$ and $S_2$ phases include stochastic signals generated by $X_2$ and $X_3$ drivers.

When neuron N2 spikes at the third E phase, it behaves similar to the neuron N1, wherein at a $S_1$ phase there is signal overlap marked by ellipses 362 and 363 representing signal overlap at N1 membrane and N2 dendrite, respectively. The signals at $S_1$ phases are the same magnitude, wherein the signal at 362 is stochastic. As such, in the two neuron circuit 350, if N1 membrane is turned on and N2 dendrite is turned on, wherein due to switching action of $FET_1$ and $FET_2$ (as controlled by the signal on a, m and d terminals, described above) current flows through resistor $R_{12}$ via $FET_1$ for programming $R_{12}$ (i.e., $R_{12}$ is set). There is no other time in the timing diagram 300 wherein N1 membrane and N2 dendrite have turned on at the same time.

Similarly, in a $S_2$ phase after N2 spikes, the N1 dendrite is turned on and the N2 membrane is turned on. At a $S_2$ phase there is signal overlap marked by ellipses 364 and 365 representing signal overlap at N1 dendrite and N2 membrane, respectively. The signals at $S_2$ phases are the same magnitude, wherein the signal at 364 is stochastic. As such, current flows through the resistor $R_{21}$ via $FET_2$ for programming the resistor $R_{21}$ (i.e., $R_{21}$ is reset). Operation in a phased operation manner, allows generating short duration signals in a neuromorphic network, confined to the phases, wherein action of the signals from different neurons appropriately captures spiking order, and changes the resistances in the synapses between the neurons, according to embodiments of the invention.

Figure 16:
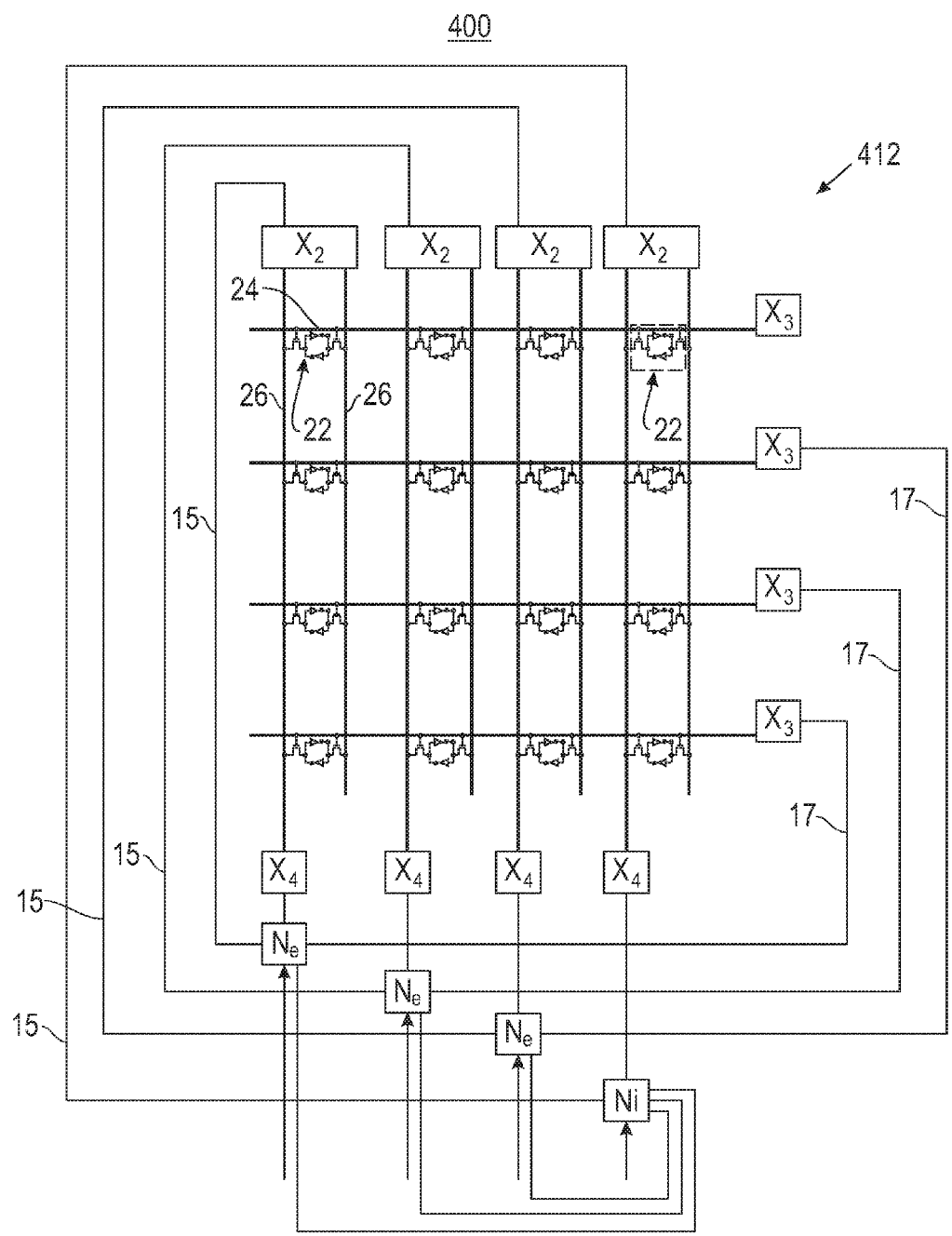
FIG. 16 shows a diagram of a neuromorphic network comprising a probabilistic asynchronous static random access (SRAM) synaptic cross-bar array circuit for spiking computation, in accordance with another embodiment of the invention.

Referring to the diagram in FIG. 16, in another embodiment, the invention provides a probabilistic asynchronous synaptic network 400 implementing binary stochastic spike-timing-dependent plasticity using a cross-bar array 412 of including static random access memory (SRAM) devices 22 at cross-point junctions of the cross-bar array 412. In one embodiment, each synapse device 22 comprises a binary state SRAM device including transistor devices.

The term electronic neuron as used herein represents an architecture configured to simulate a biological neuron. An electronic neuron creates connections between processing elements that are roughly functionally equivalent to neurons of a biological brain. As such, a neuromorphic system comprising electronic neurons according to embodiments of the invention may include various electronic circuits that are modeled on biological neurons. Further, a neuromorphic system comprising electronic neurons according to embodiments of the invention may include various processing elements (including computer simulations) that are modeled on biological neurons. Although certain illustrative embodiments of the invention are described herein using electronic neurons comprising electronic circuits, the present invention is not limited to electronic circuits. A neuromorphic system according to embodiments of the invention can be implemented as a neuromorphic architecture comprising analog or digital circuitry, and additionally as a computer simulation. Indeed, the embodiments of the invention can take the form of an entirely hardware embodiment, an entirely software embodiment or an embodiment containing both hardware and software elements.

Embodiments of the invention can take the form of a computer simulation or program product accessible from a computer-usable or computer-readable medium providing program code for use by or in connection with a computer, processing device, or any instruction execution system. As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 17:
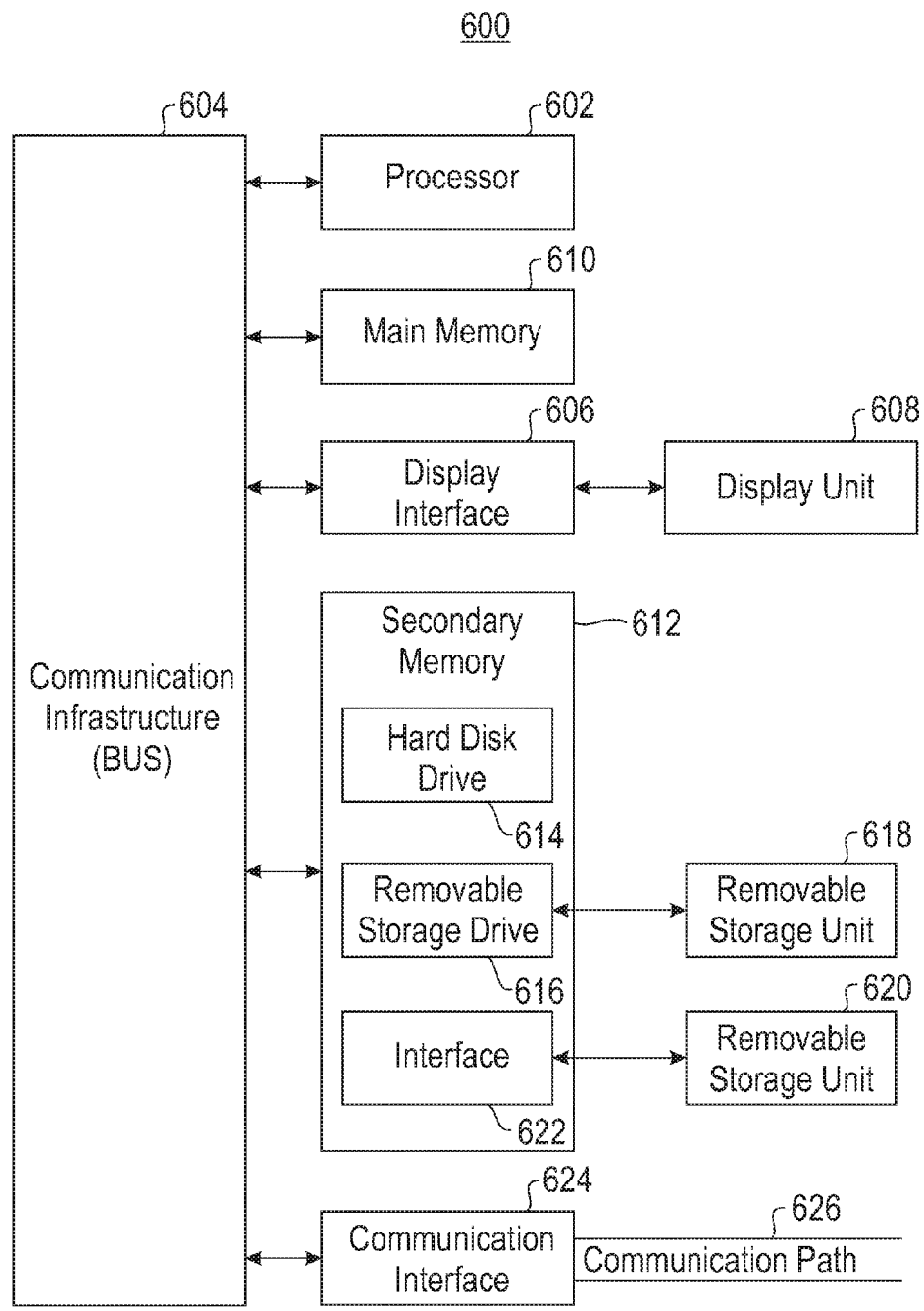
FIG. 17 shows a high level block diagram of an information processing system useful for implementing one embodiment of the present invention.

FIG. 17 is a high level block diagram showing an information processing system 600 useful for implementing one embodiment of the present invention. The computer system includes one or more processors, such as a processor 602. The processor 602 is connected to a communication infrastructure 604 (e.g., a communications bus, cross-over bar, or network).

The computer system can include a display interface 606 that forwards graphics, text, and other data from the communication infrastructure 604 (or from a frame buffer not shown) for display on a display unit 608. The computer system also includes a main memory 610, preferably random access memory (RAM), and may also include a secondary memory 612. The secondary memory 612 may include, for example, a hard disk drive 614 and/or a removable storage drive 616, representing, for example, a floppy disk drive, a magnetic tape drive, or an optical disk drive. The removable storage drive 616 reads from and/or writes to a removable storage unit 618 in a manner well known to those having ordinary skill in the art. Removable storage unit 618 represents, for example, a floppy disk, a compact disc, a magnetic tape, or an optical disk, etc., which is read by and written to by removable storage drive 616. As will be appreciated, the removable storage unit 618 includes a computer readable medium having stored therein computer software and/or data.

In alternative embodiments, the secondary memory 612 may include other similar means for allowing computer programs or other instructions to be loaded into the computer system. Such means may include, for example, a removable storage unit 620 and an interface 622. Examples of such means may include a program package and package interface (such as that found in video game devices), a removable memory chip (such as an EPROM, or PROM) and associated socket, and other removable storage units 620 and interfaces 622 which allow software and data to be transferred from the removable storage unit 620 to the computer system.

The computer system may also include a communications interface 624. Communications interface 624 allows software and data to be transferred between the computer system and external devices. Examples of communications interface 624 may include a modem, a network interface (such as an Ethernet card), a communications port, or a PCMCIA slot and card, etc. Software and data transferred via communications interface 624 are in the form of signals which may be, for example, electronic, electromagnetic, optical, or other signals capable of being received by communications interface 624. These signals are provided to communications interface 624 via a communications path (i.e., channel) 626. This communications path 626 carries signals and may be implemented using wire or cable, fiber optics, a phone line, a cellular phone link, an radio frequency (RF) link, and/or other communication channels.

In this document, the terms "computer program medium," "computer usable medium," and "computer readable medium" are used to generally refer to media such as main memory 610 and secondary memory 612, removable storage drive 616, and a hard disk installed in hard disk drive 614.

Computer programs (also called computer control logic) are stored in main memory 610 and/or secondary memory 612. Computer programs may also be received via a communication interface 624. Such computer programs, when run, enable the computer system to perform the features of the present invention as discussed herein. In particular, the computer programs, when run, enable the processor 602 to perform the features of the computer system. Accordingly, such computer programs represent controllers of the computer system.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method, comprising:
   at a neural network comprising a plurality of electronic neurons interconnected via plurality of electronic synapses arranged between multiple driver devices of a crossbar array:
   for a neuron of the electronic neurons connected to a corresponding dendrite driver device at a first side of the crossbar array, a corresponding translator device at a second side the crossbar array, and a corresponding axon driver device at a third side of the crossbar array orthogonal to the first side and the second side:
detecting, via the translator device, one or more current levels from one or more of the electronic synapses;
for each current level detected from each electronic synapse, translating, via the translator device, the current level to a binary digital signal for integration by an electronic neuron coupled to the electronic synapse, wherein the current level and the binary digital signal have different amounts of current; and
generating, via the dendrite driver device and the axon driver device, global timing reference signals for controlling phased operation of the plurality of electronic neurons, wherein neuron activity of each electronic neuron is confined to a sequence of consecutive time phases based on the global timing reference signals, the sequence of consecutive time phases comprise an evaluation phase, a communication phase, and a programming phase in order, and the global timing reference signals comprise a first set of signals for controlling neuron activity during the evaluation phase, a second set of signals for controlling neuron activity during the communication phase, and a third set of signals and a fourth set of signals for controlling neuron activity during the programming phase.

2. The method of claim 1, wherein:
each electronic synapse provides spike-timing dependent plasticity based on neuron activity of the electronic neurons in a time phased fashion; and
the time phased neuron activity of the electronic neurons is capable of changing a state of a variable state resistor as a function of time since a last spiking of an electronic neuron firing a spiking signal.

3. The method of claim 2, wherein:
each electronic synapse is programmable based on one or more programming signals transmitted via the neural network.

4. The method of claim 3, further comprising:
controlling neuron activity of each electronic neuron at any instant in time using the global timing reference signals;
wherein the first set of signals comprise at least one of the following: a signal for triggering an evaluation activity during which an electronic neuron determines whether a total integrated input for the neuron exceeds a pre-determined threshold value, a signal for triggering computation activity during which an electronic neuron integrates input received, and a signal for triggering refractory activity during which an electronic neuron processes input received;
wherein the second set of signals comprise a signal for triggering firing activity during which an electronic neuron generates a spike in response to determining a total integrated input for the neurons exceeds a pre-determined threshold value;
wherein the third set of signals comprise a signal for triggering a first programming interval during which an electronic neuron generates a set pulse in response to determining a total integrated input for the neurons exceeds a pre-determined threshold value; and
wherein the fourth set of signals comprise a signal for triggering a second programming interval during which an electronic neuron generates a reset pulse in response to determining a total integrated input for the neurons exceeds a pre-determined threshold value.

5. The method of claim 4, further comprising:
for each electronic neuron:
in the evaluation phase, determining whether a total integrated input for the neuron exceeds a pre-determined threshold value to generate a spike; and
in response to determining the total integrated input exceeds the pre-determined threshold value:
in the communication phase, initializing a time counter that keeps track of the time since the total integrated input for the neuron exceeds the pre-determined threshold value, such that the time counter begins its operation of time counting;
in the communication phase, generating a read signal, generating a bias potential, and integrating signals received;
in the programming phase, during the first programming interval, generating a set pulse; and
in the programming phase, during the second programming interval, generating a reset pulse.

6. The method of claim 5, further comprising:
for each electronic neuron:
generating a signal for decreasing or increasing resistance of a variable state resistor in an electronic synapse connected between the neuron and another electronic neuron of the electronic neurons.

7. The method of claim 6, further comprising:
for each electronic neuron:
in the programming phase, during the first programming interval, generating an enable pulse of decreasing strength as a function of a value of the time counter that keeps track of the time elapsed since the total integrated input exceeds the pre-determined threshold value.

8. The method of claim 7, further comprising:
for each electronic neuron:
in the programming phase, during the second programming interval, generating an enable pulse of decreasing strength as a function of a value of the time counter that keeps track of the time elapsed since the total integrated input exceeds the pre-determined threshold value.

9. A system comprising a computer processor, a computer-readable hardware storage medium, and program code embodied with the computer-readable hardware storage medium for execution by the computer processor to implement a method comprising:
at a neural network comprising a plurality of electronic neurons interconnected via plurality of electronic synapses arranged between multiple driver devices of a crossbar array:
for a neuron of the electronic neurons connected to a corresponding dendrite driver device at a first side of the crossbar array, a corresponding translator device at a second side the crossbar array, and a corresponding axon driver device at a third side of the crossbar array orthogonal to the first side and the second side:
detecting, via the translator device, one or more current levels from one or more of the electronic synapses;
for each current level detected from each electronic synapse, translating, via the translator device, the current level to a binary digital signal for integration by an electronic neuron coupled to the electronic synapse, wherein the current level and the binary digital signal have different amounts of current; and generating, via the dendrite driver device and the axon driver device, global timing reference signals for controlling phased operation of the plurality of electronic neurons, wherein neuron activity of each electronic neuron is confined to a sequence of consecutive time phases based on the global timing reference signals, the sequence of consecutive time phases comprise an evaluation phase, a communication phase, and a programming phase in order, and the global timing reference signals comprise a first set of signals for controlling neuron activity during the evaluation phase, a second set of signals for controlling neuron activity during the communication phase, and a third set of signals and a fourth set of signals for controlling neuron activity during the programming phase.

10. The system of claim 9, wherein:
each electronic synapse provides spike-timing dependent plasticity based on neuron activity of the electronic neurons in a time phased fashion; and
the time phased neuron activity of the electronic neurons is capable of changing a state of a variable state resistor as a function of time since a last spiking of an electronic neuron firing a spiking signal.

11. The system of claim 10, wherein:
each electronic synapse is programmable based on one or more programming signals transmitted via the neural network.

12. The system of claim 11, the method further comprising:
controlling neuron activity of each electronic neuron at any instant in time using the global timing reference signals;
wherein the first set of signals comprise at least one of the following: a signal for triggering an evaluation activity during which an electronic neuron determines whether a total integrated input for the neuron exceeds a pre-determined threshold value, a signal for triggering computation activity during which an electronic neuron integrates input received, and a signal for triggering refractory activity during which an electronic neuron processes input received;
wherein the second set of signals comprise a signal for triggering firing activity during which an electronic neuron generates a spike in response to determining a total integrated input for the neurons exceeds a pre-determined threshold value;
wherein the third set of signals comprise a signal for triggering a first programming interval during which an electronic neuron generates a set pulse in response to determining a total integrated input for the neurons exceeds a pre-determined threshold value; and
wherein the fourth set of signals comprise a signal for triggering a second programming interval during which an electronic neuron generates a reset pulse in response to determining a total integrated input for the neurons exceeds a pre-determined threshold value.

13. The system of claim 12, the method further comprising:
for each electronic neuron:
in the evaluation phase, determining whether a total integrated input for the neuron exceeds a pre-determined threshold value to generate a spike; and
in response to determining the total integrated input exceeds the pre-determined threshold value:
in the communication phase, initializing a time counter that keeps track of the time since the total integrated input for the neuron exceeds the pre-determined threshold value, such that the time counter begins its operation of time counting;
in the communication phase, generating a read signal, generating a bias potential, and integrating signals received;
in the programming phase, during the first programming interval, generating a set pulse; and
in the programming phase, during the second programming interval, generating a reset pulse.

14. The system of claim 13, the method further comprising:
for each electronic neuron:
generating a signal for decreasing or increasing resistance of a variable state resistor in an electronic synapse connected between the neuron and another electronic neuron of the electronic neurons.

15. The system of claim 14, the method further comprising:
for each electronic neuron:
in the programming phase, during the first programming interval, generating an enable pulse of decreasing strength as a function of a value of the time counter that keeps track of the time elapsed since the total integrated input exceeds the pre-determined threshold value.

16. The system of claim 15, the method further comprising:
for each electronic neuron:
in the programming phase, during the second programming interval, generating an enable pulse of decreasing strength as a function of a value of the time counter that keeps track of the time elapsed since the total integrated input exceeds the pre-determined threshold value.

17. A computer program product comprising a computer-readable hardware storage device having program code embodied therewith, the program code being executable by a computer to implement a method comprising:
at a neural network comprising a plurality of electronic neurons interconnected via plurality of electronic synapses arranged between multiple driver devices of a crossbar array:
for a neuron of the electronic neurons connected to a corresponding dendrite driver device at a first side of the crossbar array, a corresponding translator device at a second side the crossbar array, and a corresponding axon driver device at a third side of the crossbar array orthogonal to the first side and the second side:
detecting, via the translator device, one or more current levels from one or more of the electronic synapses;
for each current level detected from each electronic synapse, translating, via the translator device, the current level to a binary digital signal for integration by an electronic neuron coupled to the electronic synapse, wherein the current level and the binary digital signal have different amounts of current; and
generating, via the dendrite driver device and the axon driver device, global timing reference signals for controlling phased operation of the plurality of electronic neurons, wherein neuron activity of each electronic neuron is confined to a sequence of consecutive time phases based on the global timing reference signals, the sequence of consecutive time phases comprise an evaluation phase, a communication phase, and a programming phase in order, and the global timing reference signals comprise a first set of signals for controlling neuron activity during the evaluation phase, a second set of signals for controlling neuron activity during the communication phase, and a third set of signals and a fourth set of signals for controlling neuron activity during the programming phase.

* * * * *